US009448478B2

(12) United States Patent
Irie et al.

(10) Patent No.: US 9,448,478 B2
(45) Date of Patent: Sep. 20, 2016

(54) CHEMICALLY AMPLIFIED POSITIVE-TYPE PHOTOSENSITIVE RESIN COMPOSITION FOR THICK-FILM APPLICATION

(71) Applicant: Tokyo Ohka Kogyo Co., Ltd., Kawasaki-shi (JP)

(72) Inventors: Makiko Irie, Kawasaki (JP); Aya Momozawa, Kawasaki (JP); Yuta Yamamoto, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/662,636

(22) Filed: Mar. 19, 2015

(65) Prior Publication Data

US 2015/0268557 A1 Sep. 24, 2015

(30) Foreign Application Priority Data

Mar. 20, 2014 (JP) ................................ 2014-058735
Feb. 9, 2015 (JP) ................................ 2015-023587

(51) Int. Cl.
*G03F 7/039* (2006.01)
*G03F 7/09* (2006.01)
*G03F 7/20* (2006.01)
*G03F 7/40* (2006.01)

(52) U.S. Cl.
CPC ........... *G03F 7/0392* (2013.01); *G03F 7/0397* (2013.01); *G03F 7/09* (2013.01); *G03F 7/20* (2013.01); *G03F 7/40* (2013.01); *H05K 2203/0514* (2013.01)

(58) Field of Classification Search
None
See application file for complete search history.

(56) References Cited

U.S. PATENT DOCUMENTS

2004/0038148 A1* 2/2004 Ohta .................... G03F 7/0392 430/270.1
2004/0170925 A1* 9/2004 Roach .................. G03F 7/0047 430/281.1
2005/0124774 A1* 6/2005 Allen .................... G03F 7/0397 526/266
2007/0015080 A1* 1/2007 Toukhy .................. G03F 7/022 430/270.1
2010/0047715 A1* 2/2010 Washio ................ G03F 7/0045 430/286.1
2010/0248148 A1* 9/2010 Dazai .................... G03F 7/0397 430/286.1
2011/0091820 A1* 4/2011 Hata ..................... G03F 7/0035 430/325
2011/0117332 A1* 5/2011 Seong .................. C08F 212/08 428/195.1
2012/0184100 A1* 7/2012 Yasuda ................ G03F 7/0046 438/676
2013/0095424 A1* 4/2013 Ichikawa ............. G03F 7/0397 430/270.1

FOREIGN PATENT DOCUMENTS

EP 2551722 a1 * 1/2013
JP H09-176112 7/1997
JP H11-52562 2/1999
JP 2010-185986 8/2010
WO WO-2014/142360 a1 * 9/2014

OTHER PUBLICATIONS

"acetals", PAC, 1995, 67, 1307, (Glossary of class names of organic compounds and reactivity intermediates base on structure (IUPAC Recommendations 1995)) on p. 1310.*

* cited by examiner

*Primary Examiner* — Cynthia Hamilton
(74) *Attorney, Agent, or Firm* — Knobbe Martens Olson & Bear LLP

(57) ABSTRACT

A chemically amplified positive-type photosensitive resin composition for thick-film application capable of forming a resist pattern having a nonresist section with a good rectangular cross-sectional shape under a low exposure level even when a resist pattern having a film thickness of 10 μm or more is formed. A chemically amplified positive-type photosensitive resin composition for thick-film application comprising an acid generator and an organic solvent, in which an acrylic resin is added that contains a constituent unit derived from an acrylic acid ester comprising an $—SO_2$-containing cyclic group or a lactone-containing cyclic group as a resin whose solubility in alkali increases under the action of acid.

6 Claims, No Drawings

CHEMICALLY AMPLIFIED POSITIVE-TYPE PHOTOSENSITIVE RESIN COMPOSITION FOR THICK-FILM APPLICATION

This application claims priority to Japanese Patent Application No. 2014-058735, filed Mar. 20, 2014; and Japanese Patent Application No. 2015-023587, filed Feb. 9, 2015, the entire contents of which are incorporated herein by reference.

BACKGROUND OF THE INVENTION

1. Field of the Invention

The present invention relates to a chemically amplified positive-type photosensitive resin composition for thick-film application and a thick photosensitive dry film having a photosensitive resin layer comprising the above chemically amplified positive-type photosensitive resin composition for thick-film application. The present invention also relates to a method of manufacturing a thick resist pattern by using the above chemically amplified positive-type photosensitive resin composition for thick-film application, a method of manufacturing a substrate with a template by using the above chemically amplified positive-type photosensitive resin composition for thick-film application and a method of manufacturing a plated article using the substrate with the template manufactured by the above method.

2. Related Art

Photofabrication is now the mainstream of a microfabrication technique. Photofabrication is a generic term describing the technology used for manufacturing a wide variety of precision components such as semiconductor packages. The manufacturing is carried out by applying a photoresist composition to the surface of a processing target to form a photoresist layer, patterning this photoresist layer using photolithographic techniques, and then conducting chemical etching, electrolytic etching, and/or electroforming based mainly on electroplating, using the patterned photoresist layer (resist pattern) as a mask.

In recent years, high density packaging technologies have progressed in semiconductor packages along with downsizing electronics devices, and the increase in package density has been developed on the basis of mounting multi-pin thin film in packages, miniaturizing of package size, two-dimensional packaging technologies in flip-tip systems or three-dimensional packaging technologies. In these types of high density packaging techniques, connection terminals, including protruding electrodes (mounting terminals) known as bumps that protrude above the package or metal posts that extend from peripheral terminals on the wafer and connect rewiring with the mounting terminals, are disposed on the surface of the substrate with high precision.

In the photofabrication as described above, a photoresist composition is used, and chemically amplified photoresist compositions containing an acid generator have been known as such a photoresist composition, (see Patent Documents 1, 2 and the like). According to the chemically amplified photoresist composition, an acid is generated from the acid generator upon irradiation with radiation (exposure) and diffusion of the acid is promoted through heat treatment, to cause an acid catalytic reaction with a base resin and the like in the composition resulting in a change to the alkali-solubility of the same.

Photoresist compositions used for the photofabrication as described above also include photoresist compositions for thick-film application (see Patent Document 3 and the like). Such a photoresist composition for thick film application is used for forming, for example, bumps or metal posts through plating processes. For example, a thick photoresist layer having a film thickness of about 20 μm is formed on a support, and the photoresist layer is exposed through a predetermined mask pattern and is developed. Thereby, a resist pattern in which portions for forming bumps or metal posts have been selectively removed (stripped) is formed. Then, bumps or metal posts can be formed by embedding a conductor such as copper into the removed portions (nonresist sections) using plating, and then removing the surrounding residual resist pattern.

Patent Document 1: Japanese Unexamined Patent Application, Publication No. H09-176112

Patent Document 2: Japanese Unexamined Patent Application, Publication No. H11-52562

Patent Document 3: Japanese Unexamined Patent Application, Publication No. 2010-185986

SUMMARY OF THE INVENTION

For use in photofabrication applications as well as in other various applications, a resist pattern having a rectangular cross-sectional shape at a portion removed upon development (nonresist section) is usually desired, in a case where the resist pattern is formed with a photoresist composition for thick-film application.

Further, a photoresist composition for thick-film application as described in Patent Document 3 is often used after being diluted with a solvent. However, in a case where a thick resist pattern having a film thickness of 10 μm or more is formed with a photoresist composition for thick-film application containing a solvent, a resist pattern may not be formed in a desired shape at a low exposure level, and a resist pattern having a preferred rectangular cross-sectional shape at a nonresist section may be difficult to form. In this case, the cross-sectional shape at a nonresist section in a resist pattern tends to be a barrel-like shape in which a position corresponding to the central region in the thickness direction of the resist pattern is widened.

The above poor cross-sectional shape at a nonresist section appears to be resulted from a solvent which tends to remain in a coating comprising a photoresist composition for thick-film application to be exposed. In a case where a somewhat large amount of a solvent remains in a coating to be exposed, it is predicted that an acid produced from an acid generator upon exposure may be difficult to be uniformly dispersed through an exposed portion due to the effect of the solvent in the coating.

The present invention is made in view of the above problem. An object of the present invention is to provide a chemically amplified positive-type photosensitive resin composition for thick-film application capable of forming a resist pattern having a nonresist section with a good rectangular cross-sectional shape under a low exposure level even in a case where a resist pattern having a film thickness of 10 μm or more is formed. Another object of the present invention is to provide a thick photosensitive dry film having a photosensitive resin layer comprising the above chemically amplified positive-type photosensitive resin composition for thick-film application. Still another object of the present invention is to provide a method of manufacturing a thick resist pattern by using the above chemically amplified positive-type photosensitive resin composition for thick-film application. Yet another object of the present invention is to provide a method of manufacturing a substrate with a template by using the above chemically amplified positive-type photosensitive resin composition for thick-film application. Yet still another object of the present invention is to provide a method of manufacturing a plated article using the substrate with the template manufactured by the above method.

The present inventors find that the above problem can be solved by providing a chemically amplified positive-type photosensitive resin composition for thick-film application comprising: an (A) acid generator capable of producing an acid when irradiated with an active ray or radiation, and an (S) organic solvent, wherein a (B-3) acrylic resin containing a constituent unit derived from an acrylic acid ester comprising an —$SO_2$-containing cyclic group or a lactone-containing cyclic group is added as a (B) resin whose solubility in alkali increases under the action of acid. Then the present inventors have completed the present invention.

A first aspect of the present invention is a chemically amplified positive-type photosensitive resin composition for thick-film application used for forming a thick resist pattern having a film thickness of 10 μm or more containing an (A) acid generator capable of producing an acid when irradiated with an active ray or radiation, a (B) resin whose solubility in alkali increases under the action of acid, and an (S) organic solvent, wherein the (B) resin whose solubility in alkali increases under the action of acid comprises a (B-3) acrylic resin containing a constituent unit derived from an acrylic acid ester comprising an —$SO_2$-containing cyclic group or a lactone-containing cyclic group, and wherein the percentage of the acrylic resin (B-3) to the total mass of resin components contained in the chemically amplified positive-type photosensitive resin composition for thick-film application is 70% by mass or more.

A second aspect of the present invention is the chemically amplified positive-type photosensitive resin composition for thick-film application according to the first aspect, which is used to form a template for forming a plated article on a metal substrate.

A third aspect of the present invention is a thick photosensitive dry film having a base film and a thick photosensitive resin layer formed on a surface of the base film, wherein the thick photosensitive resin layer comprises the chemically amplified positive-type photosensitive resin composition for thick-film application according to the first aspect.

A fourth aspect of the present invention is the thick photosensitive dry film according to according to the third aspect, wherein the thick photosensitive resin layer has a film thickness of 5 to 300 μm.

A fifth aspect of the present invention is a method of manufacturing a thick resist pattern, comprising a laminating step of laminating a photosensitive resin layer on a substrate, the photosensitive resin layer comprising the chemically amplified positive-type photosensitive resin composition for thick-film application according to the first aspect, a exposure step of irradiating the photosensitive resin layer with an active ray or radiation, and a developing step of developing the photosensitive resin layer after the exposure.

A sixth aspect of the present invention is a method of manufacturing a substrate with a template, comprising a laminating step of laminating a photosensitive resin layer on a metal substrate, the photosensitive resin layer comprising the chemically amplified positive-type photosensitive resin composition for thick-film application according to the second aspect used to form the template for forming a plated article, a exposure step of irradiating the photosensitive resin layer with an active ray or radiation, and a developing step of developing the photosensitive resin layer after the exposure to form the template for forming a plated article.

A seventh aspect of the present invention is a method of manufacturing a plated article, comprising a step of plating the substrate with the template manufactured by the method according to the sixth aspect to form the plated article within the template.

A eighth aspect of the present invention is a chemically amplified positive-type photosensitive resin composition, comprising an (A) acid generator that produces an acid by being irradiated with an active ray or radiation, a (B) resin whose solubility in alkali increases under the action of acid, and an (S) organic solvent, wherein the (B) resin comprises a (B-3) acrylic resin comprising a constituent unit derived from an acrylic acid ester comprising an —$SO_2$-containing cyclic group or a lactone-containing cyclic group, and the percentage of the (B-3) acrylic resin to the total mass of resin components contained in the composition is 70% by mass or more.

A ninth aspect of the present invention is the composition according to the eighth aspect, that is used to form a thick resist pattern having a film thickness of 10 μm or more.

A tenth aspect of the present invention is the composition according to the eighth aspect, that is used to form a template that defines a plated article on a metal substrate.

A eleventh aspect of the present invention is a thick photosensitive dry film comprising a base film and a thick photosensitive resin layer formed on the base film, wherein the layer comprises the composition according to the eighth aspect.

A twelfth aspect of the present invention is the dry film according to the eleventh aspect, wherein the layer has a film thickness of 5 to 300 μm.

A thirteenth aspect of the present invention is a method of manufacturing a thick resist pattern, comprising:

laminating a thick photosensitive resin layer on a substrate, the layer comprising the composition according to the eighth aspect, irradiating the layer with an active ray or radiation, and developing the layer after the exposure, wherein a film thickens of the thick resist pattern is 10 μm or more.

A fourteenth aspect of the present invention is a method of manufacturing a substrate with a template, comprising:

laminating a photosensitive resin layer on a metal substrate, the layer comprising the composition according to the eighth or tenth aspect, irradiating the layer with an active ray or radiation, and developing the layer after the exposure to form the template that defines a plated article.

wherein a film thickness of the template is 10 μm or more.

A fifteenth aspect of the present invention is a method of manufacturing a plated article, comprising plating the substrate with the template manufactured by the method according to the fourteenth aspect to form the plated article inside the template.

A sixteenth aspect of the present invention is a thick resist pattern comprising an (A) acid generator that produces an acid by being irradiated with an active ray or radiation, and a (B) resin whose solubility in alkali increases under the action of acid, wherein a thickness of the thick resist pattern is 10 μm or more.

A seventeenth aspect of the present invention is a thick photosensitive resin layer comprising an (A) acid generator that produces an acid by being irradiated with an active ray or radiation, and a (B) resin whose solubility in alkali increases under the action of acid, and optionally comprising an (S) organic solvent, wherein a thickness of the layer is from 5 μm to 300 μm.

The present invention can provide a chemically amplified positive-type photosensitive resin composition for thick-film application capable of forming a resist pattern having a nonresist section with a good rectangular cross-sectional shape under a low exposure level even in a case where a resist pattern having a film thickness of 10 μm or more is formed; a thick photosensitive dry film having a photosensitive resin layer comprising the above chemically amplified positive-type photosensitive resin composition for thick-film application; a method of manufacturing a thick resist pattern by using the above chemically amplified positive-type photosensitive resin composition for thick-film application; a method of manufacturing a substrate with a template by using the above chemically amplified positive-type photosensitive resin composition for thick-film application; and a method of manufacturing a plated article using the substrate with the template manufactured by the above method.

DETAILED DESCRIPTION OF THE INVENTION

Chemically Amplified Positive-Type Photosensitive Resin Composition

The chemically amplified positive-type photosensitive resin composition (hereinafter also referred to as the "photosensitive resin composition") contains an (A) acid generator capable of producing an acid when irradiated with an active ray or radiation (hereinafter also referred to as the (A) acid generator), a (B) resin whose solubility in alkali increases under the action of acid (hereinafter also referred to as the (B) resin), and an (S) organic solvent. The photosensitive resin composition may comprise one or more components selected from a (C) alkali-soluble resin and a (D) acid diffusion suppressing agent, if desired.

The photosensitive resin composition is preferably used for forming a thick resist pattern. The film thickness of a resist pattern formed with the photosensitive resin composition is 10 μm or more, preferably 10 to 150 μm, more preferably 20 to 120 μm, and in particular preferably 20 to 80 μm.

(A) Acid Generator

The (A) acid generator is a compound capable of producing an acid when irradiated with an active ray or radiation, and is not particularly limited as long as it is a compound which directly or indirectly produces an acid under the action of light. The (A) acid generator is preferably any one of the acid generators of the first to fifth aspects that will be described below. Hereinafter, suitable examples among the (A) acid generators that are suitably used in photosensitive resin compositions will be described as the first to fifth aspects.

The first aspect of the (A) acid generator may be a compound represented by the following formula (a1).

(a1)

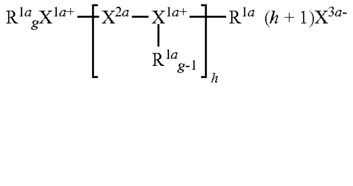

In the formula (a1), $X^{1a}$ represents a sulfur atom or iodine atom respectively having a valence of g; g represents 1 or 2. h represents the number of repeating units in the structure within parentheses. $R^{1a}$ represents an organic group that is bonded to $X^{1a}$, and represents an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms, and $R^{1a}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen atoms. The number of $R^{1a}$s is g+h(g−1)+1, and the $R^{1a}$s may be respectively identical to or different from each other. Furthermore, two or more $R^{1a}$s may be bonded to each other directly or via —O—, —S—, —SO—, —$SO_2$—, —NH—, —$NR^{2a}$—, —CO—, —COO—, —CONH—, an alkylene group having 1 to 3 carbon atoms, or a phenylene group, and may form a ring structure containing $X^{1a}$. $R^{2a}$ represents an alkyl group having 1 to 5 carbon atoms, or an aryl group having 6 to 10 carbon atoms.

$X^{2a}$ represents a structure represented by the following formula (a2).

$$-X^{4a}\left[X^{5a}-X^{4a}\right]_h \qquad \text{(a2)}$$

In the formula (a2) $X^{4a}$ represents an alkylene group having 1 to 8 carbon atoms, an arylene group having 6 to 20 carbon atoms, or a divalent group of a heterocyclic compound having 8 to 20 carbon atoms, and $X^{4a}$ may be substituted with at least one selected from the group consisting of an alkyl group having 1 to 8 carbon atoms, an alkoxy group having 1 to 8 carbon atoms, an aryl group having 6 to 10 carbon atoms, a hydroxyl group, a cyano group, a nitro group, and halogen atoms. $X^{5a}$ represents —O—, —S—, —SO—, —$SO_2$—, —NH—, —$NR^{2a}$—, —CO—, —COO—, —CONH—, an alkylene group having 1 to 3 carbon atoms, or a phenylene group. h represents the number of repeating units of the structure in parentheses. $X^{4a}$s in the number of h+1 and $X^{5a}$s in the number of h may be identical to or different from each other. $R^{2a}$ has the same definition as described above.

$X^{3a-}$ represents a counterion of an onium, and examples thereof include a fluorinated alkylfluorophosphoric acid anion represented by the following formula (a17) or a borate anion represented by the following formula (a18).

$$[(R^{3a})PF_{6-j}]^- \qquad \text{(a17)}$$

In the formula (a17), $R^{1a}$ represents an alkyl group having 80% or more of the hydrogen atoms substituted by fluorine atoms. j represents the number of $R^{3a}$s and is an integer from 1 to 5. $R^{3a}$s in the number of j may be respectively identical to or different from each other.

(a18)

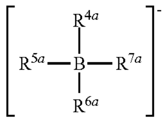

In the formula (a18) $R^{4a}$ to $R^{7a}$ each independently represents a fluorine atom or a phenyl group, and a part or all of the hydrogen atoms of the phenyl group may be substituted by at least one selected from the group consisting of a fluorine atom and a trifluoromethyl group.

Examples of the onium ion in the compound represented by the formula (a1) include triphenylsulfonium, tri-p-tolylsulfonium, 4-(phenylthio)phenyldiphenylsulfonium, bis[4-(diphenylsulfonio)phenyl]sulfide, bis[4-{bis[4-(2-hydroxyethoxyl)phenyl]sulfonio}phenyl]sulfide, bis{4-[bis(4-fluorophenyl)sulfonio]phenyl}sulfide, 4-(4-benzoyl-2-chlorophenylthio)phenylbis(4-fluorophenyl)sulfonium, 7-isopropyl-9-oxo-10-thia-9,10-dihydroanthran-2-yldi-p-tolylsulfonium, 7-isopropyl-9-oxo-10-thia-9,10-dihydroanthracen-2-yldiphenylsulfonium, 2-[(diphenyl)sulfonio]thioxanthone, 4-[4-(4-tert-butylbenzoyl)phenylthio]phenyldi-p-tolylsulfonium, 4-(4-benzoylphenylthio)phenyldiphenylsulfonium, diphenylphenacylsulfonium, 4-hydroxyphenylmethylbenzylsulfonium, 2-naphthylmethyl(1-ethoxycarbonyl)ethylsulfonium, 4-hydroxyphenylmethylphenacylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, and 4-isobutylphenyl(p-tolyl)iodonium.

Among the onium ions in the compound represented by the formula (a1), a preferred onium ion may be a sulfonium ion represented by the following formula (a19).

(a19)

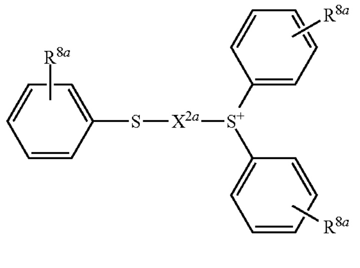

In the formula (a19), $R^{8a}$s each independently represents a hydrogen atom or a group selected from the group consisting of alkyl, hydroxyl, alkoxy, alkylcarbonyl, alkylcarbonyloxy, alkyloxycarbonyl, a halogen atom, an aryl, which may be substituted, and arylcarbonyl. $X^{2a}$ has the same definition as $X^{2a}$ in the formula (a1).

Specific examples of the sulfonium ion represented by the formula (a19) include 4-(phenylthio)phenyldiphenylsulfonium, 4-(4-benzoyl-2-chlorophenylthio)phenylbis(4-fluorophenyl)sulfonium, 4-(4-benzoylphenylthio)phenyldiphenylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, and diphenyl[4-(p-terphenylthio)phenyl]diphenylsulfonium.

In regard to the fluorinated alkylfluorophosphoric acid anion represented by the formula (a17), $R^{3a}$ represents an alkyl group substituted with a fluorine atom, and a preferred number of carbon atoms is 1 to 8, while a more preferred number of carbon atoms is 1 to 4. Specific examples of the alkyl group include linear alkyl groups such as methyl, ethyl, propyl, butyl, pentyl and octyl; branched alkyl groups such as isopropyl, isobutyl, sec-butyl and tert-butyl; and cycloalkyl groups such as cyclopropyl, cyclobutyl, cyclopentyl, and cyclohexyl. The proportion of hydrogen atoms substituted by fluorine atoms in the alkyl groups is usually 80% or more, preferably 90% or more, and even more preferably 100%. If the substitution ratio of fluorine atoms is less than 80%, the acid strength of the onium fluorinated alkylfluorophosphate represented by the formula (a1) decreases.

A particularly preferred example of $R^{3a}$ is a linear or branched perfluoroalkyl group having 1 to 4 carbon atoms and a substitution ratio of fluorine atoms of 100%. Specific examples thereof include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$. j which is the number of $R^{1a}$s represents an integer from 1 to 5, and is preferably 2 to 4, and particularly preferably 2 or 3.

Preferred specific examples of the fluorinated alkylfluorophosphoric acid anion include $[(CF_3CF_2)_2PF_4]^-$, $[(CF_3CF_2)_3PF_3]^-$, $[((CF_3)_2CF)_2PF_4]^-$, $[((CF_3)_2CF)_3PF_3]^-$, $[(CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[(CF_3CF_2CF_2CF_2)_2PF_4]^-$, and $[(CF_3CF_2CF_2)_3PF_3]^-$. Among these, $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$, and $[((CF_3)_2CFCF_2)_2PF_4]^-$ are particularly preferred.

Preferred specific examples of the borate anion represented by the formula (a18) include tetrakis(pentafluorophenyl)borate ($[B(C_6F_5)_4]^-$), tetrakis[(trifluoromethyl)phenyl]borate ($[B(C_6H_4CF_3)_4]^-$), difluorobis(pentafluorophenyl)borate ($[(C_6F_5)_2BF_2]^-$), trifluoro(pentafluorophenyl)borate ($[(C_6F_5)BF_3]^-$), and tetrakis(difluorophenyl)borate ($[B(C_6H_3F_2)_4]^-$). Among these, tetrakis(pentafluorophenyl)borate ($[B(C_6F_5)_4]^-$) is particularly preferred.

The second aspect of the (A) acid generator include halogen-containing triazine compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6- bis(trichloromethyl)-1,3,5-triazine, 2-(4-methoxynaphthyl)-4,6-bis(trichloromethyl)-1,3,5-triazine, 2-[2-(2-furyl) ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis (trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis (trichloromethyl)-1,3,5-triazine, tris(1,3-dibromopropyl)-1, 3,5-triazine and tris(2,3-dibromopropyl)-1,3,5-triazine, and halogen-containing triazine compounds represented by the following formula (a3) such as tris(2,3-dibromopropyl)isocyanurate.

(a3)

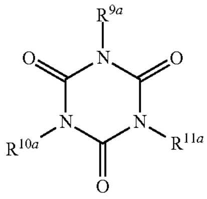

In the formula (a3), $R^{9a}$, $R^{10a}$ and $R^{11a}$ each independently represent a halogenated alkyl group.

Further, the third aspect of the (A) acid generator include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile and α-(ethylsulfonyloxyimino)-1-cyclopentenylacetonitrile, and compounds represented by the following formula (a4) having an oximesulfonate group.

(a4)

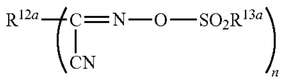

In the formula (a4), $R^{12a}$ represents a monovalent, bivalent or trivalent organic group, $R^{13a}$ represents a substituted or unsubstituted saturated hydrocarbon group, an unsaturated hydrocarbon group, or an aromatic compound group, and n represents the number of repeating units of the structure in the parentheses.

In the formula (a4), the aromatic compound group indicates a group of compounds having physical and chemical properties characteristic of aromatic compounds, and examples thereof include aryl groups such as a phenyl group and a naphthyl group, and heteroaryl groups such as a furyl group and a thienyl group may be exemplified. These may have one or more appropriate substituents such as halogen atoms, alkyl groups, alkoxy groups and nitro groups on the rings. It is particularly preferable that $R^{13a}$ is an alkyl group having 1 to 6 carbon atoms such as a methyl group, an ethyl group, a propyl group, and a butyl group. In particular, compounds in which $R^{12a}$ represents an aromatic compound group, and $R^{13a}$ represents an alkyl group having 1 to 4 carbon atoms are preferred.

Examples of the acid generator represented by the formula (a4), include compounds in which $R^{12a}$ is any one of a phenyl group, a methylphenyl group and a methoxyphenyl group, and $R^{13a}$ is a methyl group, provided that n is 1, and specific examples thereof include α-(methylsulfonyloxyimino)-1-phenylacetonitrile, α-(methylsulfonyloxyimino)-1-(p-methylphenyl)acetonitrile, α-(methylsulfonyloxyimino)-1-(p-methoxyphenyl)acetonitrile, [2-(propylsulfonyloxyimino)-2,3-dihydroxythiophene-3-ylidene](o-tolyl)acetonitrile and the like. Provided that n is 2, the acid generator represented by the formula (a4) is specifically an acid generator represented by the following formulae.

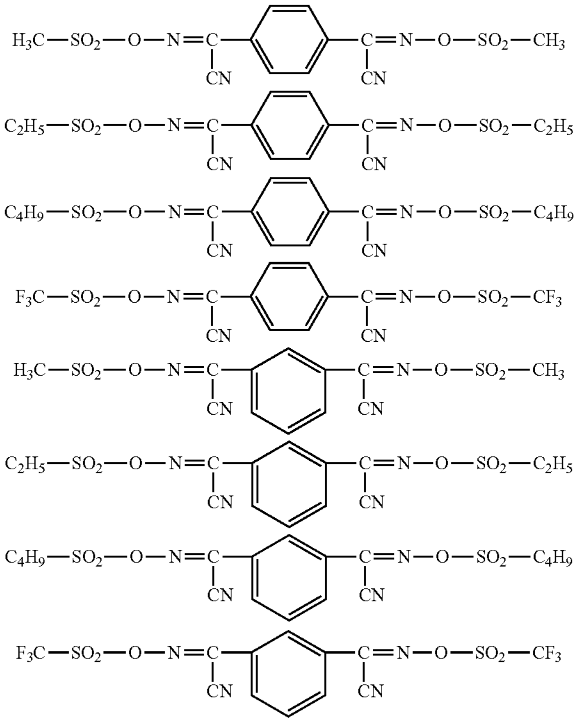

In addition, the fourth aspect of the (A) acid generator include onium salts that have a naphthalene ring at their cation moiety. The expression "have a naphthalene ring" indicates having a structure derived from naphthalene and also indicates at least two ring structures and their aromatic properties are maintained. The naphthalene ring may have a substituent such as a linear or branched alkyl group having 1 to 6 carbon atoms, a hydroxyl group, a linear or branched alkoxy group having 1 to 6 carbon atoms or the like. The structure derived from the naphthalene ring, which may be of a monovalent group (one free valance) or of a bivalent group (two free valences), is desirably of a monovalent group (in this regard, the number of free valance is counted except for the portions connecting with the substituents described above). The number of naphthalene rings is preferably 1 to 3.

Preferably, the cation moiety of the onium salt having a naphthalene ring at the cation moiety is of the structure represented by the following general formula (a5).

(a5)

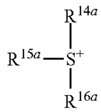

In the formula (a5), at least one of $R^{14a}$, $R^{15a}$ and $R^{16a}$ represents a group represented by the following formula (a6), and the remaining represents a linear or branched alkyl group having 1 to 6 carbon atoms, a phenyl group which may have a substituent, a hydroxyl group, or a linear or branched alkoxy group having 1 to 6 carbon atoms. Alternatively, one of $R^{14a}$, $R^{15a}$ and $R^{16a}$ is a group represented by the following formula (a6), and the remaining two are each independently a linear or branched alkylene group having 1 to 6 carbon atoms, and these terminals may bond to form a ring structure.

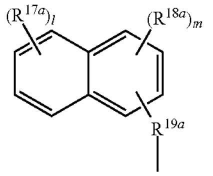
(a6)

In the formula (a6), $R^{17a}$ and $R^{18a}$ each independently represent a hydroxyl group, a linear or branched alkoxy group having 1 to 6 carbon atoms, or a linear or branched alkyl group having 1 to 6 carbon atoms, and $R^{19a}$ represents a single bond or a linear or branched alkylene group having 1 to 6 carbon atoms that may have a substituent. 1 and m each independently represent an integer of 0 to 2, and 1+m is no greater than 3. In this regard, when there exists a plurality of $R^{17a}$, they may be identical or different from each other. Furthermore, when there exist a plurality of $R^{18a}$, they may be identical or different from each other.

Preferably, among $R^{14a}$, $R^{15a}$ and $R^{16a}$ as above, the number of groups represented by the formula (a6) is one in view of the stability of the compound, and the remaining are linear or branched alkylene groups having 1 to 6 carbon atoms of which the terminals may bond to form a ring. In this case, the two alkylene groups described above form a 3 to 9 membered ring including sulfur atom(s). Preferably, the number of atoms to form the ring (including sulfur atom(s)) is 5 or 6.

The substituent, which the alkylene group may have, is exemplified by an oxygen atom (in this case, a carbonyl group is formed together with a carbon atom that constitutes the alkylene group), a hydroxyl group or the like.

Alternatively, the substituent, which the phenyl group may have, is exemplified by a hydroxyl group, a linear or branched alkoxy groups having 1 to 6 carbon atoms, linear or branched alkyl groups having 1 to 6 carbon atoms, or the like.

Examples of suitable cation moiety include those represented by the following formulae (a7) and (a8), and the structure represented by the following formula (a8) is particularly preferable.

(a7)

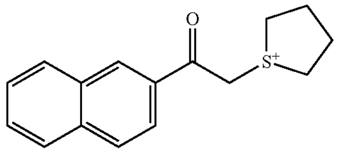

-continued (a8)

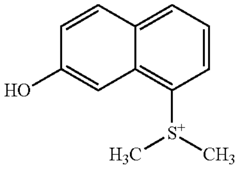

The cation moieties, which may be of an iodonium salt or a sulfonium salt, are desirably of a sulfonium salt in view of acid-producing efficiency.

It is, therefore, desirable that the preferable anion moiety of the onium salt having a naphthalene ring at the cation moiety is an anion capable of forming a sulfonium salt.

The anion moiety of the acid generator is exemplified by fluoroalkylsulfonic acid ions, of which hydrogen atom(s) being partially or entirely fluorinated, or aryl sulfonic acid ions.

The alkyl group of the fluoroalkylsulfonic acid ions may be linear, branched or cyclic and have 1 to 20 carbon atoms. Preferably, the carbon number is 1 to 10 in view of bulkiness and diffusion distance of the produced acid. In particular, branched or cyclic groups are preferable due to shorter diffusion length. Also, methyl, ethyl, propyl, butyl, octyl groups and the like are preferable due to being inexpensively synthesizable.

The aryl group of the aryl sulfonic acid ions may be an aryl group having 6 to 20 carbon atoms, and is exemplified by a phenol group or a naphthyl group that may be unsubstituted or substituted with an alkyl group or a halogen atom. In particular, aryl groups having 6 to 10 carbon atoms are preferred since they can be synthesized inexpensively. Specific examples of preferable aryl group include phenyl, toluenesulfonyl, ethylphenyl, naphthyl, methylnaphthyl groups and the like.

When hydrogen atoms in the fluoroalkylsulfonic acid ion or the aryl sulfonic acid ion are partially or entirely substituted with a fluorine atom, the fluorination rate is preferably 10% to 100%, and more preferably 50% to 100%; it is particularly preferable that all hydrogen atoms are each substituted with a fluorine atom in view of higher acid strength. Specific examples thereof include trifluoromethane sulfonate, perfluorobutane sulfonate, perfluorooctane sulfonate, perfluorobenzene sulfonate, and the like.

Among these, the preferable anion moiety is exemplified by those represented by the following formula (a9).

$R^{20a}SO_3^-$ (a9)

In the formula (a9), $R^{20a}$ represents a group represented by the following formula (a10) or (a11), or a group represented by the following formula (a12).

$-C_xF_{2x+1}$ (a10)

(a11)

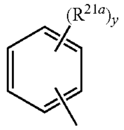

-continued (a12)

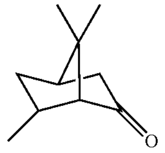

In the formula (a10), x represents an integer of 1 to 4. Also, in the formula (a11), $R^{21a}$ represents a hydrogen atom, a hydroxyl group, a linear or branched alkyl group having 1 to 6 carbon atoms, or a linear or branched alkoxy group having 1 to 6 carbon atoms, and y represents an integer of 1 to 3. Of these, trifluoromethane sulfonate, and perfluorobutane sulfonate are preferable in view of safety.

In addition, a nitrogen-containing moiety represented by the following formula (a13) or (a14) may be also be used for the anion moiety.

(a13)

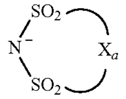

(a14)

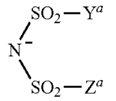

In the formulae (a13) and (a14), $X^a$ represents a linear or branched alkylene group of which at least one hydrogen atom is substituted with a fluorine atom, the carbon number of the alkylene group is 2 to 6, preferably 3 to 5, and most preferably the carbon number is 3. In addition, $Y^a$ and $Z^a$ each independently represent a linear or branched alkyl group of which at least one hydrogen atom is substituted with a fluorine atom, the number of carbon atoms of the alkyl group is 1 to 10, preferably 1 to 7, and more preferably 1 to 3.

The smaller number of carbon atoms in the alkylene group of $X^a$, or in the alkyl group of $Y^a$ or $Z^a$ is preferred since the solubility into organic solvent is favorable.

In addition, a larger number of hydrogen atoms each substituted by a fluorine atom in the alkylene group of $X^a$, or in the alkyl group of $Y^a$ or $Z^a$ is preferred since the acid strength becomes greater. The percentage of fluorine atoms in the alkylene group or alkyl group, i.e., the fluorination rate is preferably 70 to 100% and more preferably 90 to 100%, and most preferable are perfluoroalkylene or perfluoroalkyl groups in which all of the hydrogen atoms are each substituted with a fluorine atom.

Preferable onium salts having a naphthalene ring at their cation moieties are exemplified by compounds represented by the following formulae (a15) and (a16).

(a15)

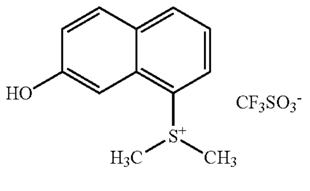

-continued (a16)

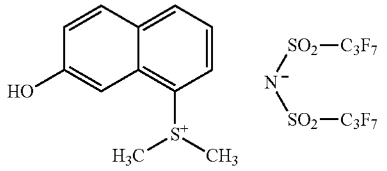

Also, the fifth aspect of the (A) acid generator include bissulfonyldiazomethanes such as bis(p-toluenesulfonyl)diazomethane, bis(1,1-dimethyl ethylsulfonyl)diazomethane, bis(cyclohexylsulfonyl)diazomethane and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate and dinitrobenzyl carbonate; sulfonates such as pyrogalloltrimesylate, pyrogalloltritosylate, benzyltosylate, benzylsulfonate, N-methylsulfonyloxysuccinimide, N-trichloromethylsulfonyloxysuccinimide, N-phenylsulfonyloxymaleimide and N-methylsulfonyloxyphthalimide; trifluoromethane sulfonates such as N-hydroxyphthalimide and N-hydroxynaphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate and (p-tert-butylphenyl) diphenylsulfonium trifluoromethanesulfonate; benzointosylates such as benzointosylate and α-methylbenzointosylate; other diphenyliodonium salts, triphenylsulfonium salts, phenyldiazonium salts, benzylcarbonates and the like.

This (A) acid generator may be used alone, or two or more kinds may be used in combination. Furthermore, the content of the (A) acid generator (A) is preferably adjusted to 0.1% to 10% by mass, and more preferably 0.5% to 3% by mass, relative to the total mass of the photosensitive resin composition. When the amount of the acid generator (A) used is adjusted to the range described above, a photosensitive resin composition that is a uniform solution having satisfactory sensitivity and exhibiting excellent storage stability can be readily prepared.

(B) Resin

The (B) resin whose solubility in alkali increases under the action of acid contains a (B-3) acrylic resin containing a constituent unit derived from an acrylic acid ester comprising an —$SO_2$-containing cyclic group or a lactone-containing cyclic group (hereinafter also referred to as the "(B-3) acrylic resin"). By including the (B-3) acrylic resin in a photosensitive resin composition, a thick pattern with a film thickness of 10 μm or more having a good cross-sectional shape can be formed. Note that the (B) resin whose solubility in alkali increases under the action of acid may comprise a resin other than the above (B-3) acrylic resin conventionally blended in a positive-type photosensitive resin composition.

The content of the (B-3) acrylic resin in the total resin components contained in a photosensitive resin composition is preferably 70% by mass or more, preferably 90% by mass or more, and more preferably 100% by mass relative to the total mass of the (B) resin whose solubility in alkali increases under the action of acid and a (C) alkali-soluble resin described below.

Below, as preferred examples of the (B) resin whose solubility in alkali increases under the action of acid, a (B1)

novolak resin, a (B-2) polyhydroxystyrene resin and an (B3) acrylic resin (B3) will be described in this order.

[(B1) Novolak Resin]

As the (B1) novolak resin, a resin including the structural unit represented by the following general formula (b1) may be used.

(b!)

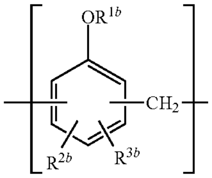

In the formula (b1), $R^{1b}$ represents an acid-dissociative dissolution-controlling group, and $R^{2b}$ and $R^{3b}$ each independently represent a hydrogen atom or an alkyl group having 1 to 6 carbon atoms.

The acid-dissociative dissolution-controlling group represented by the above $R^{1b}$ is preferably a group represented by the following formula (b2) or (b3), a linear, branched or cyclic alkyl group having 1 to 6 carbon atoms, a vinyloxyethyl group, a tetrahydropyranyl group, a tetrafuranyl group, or a trialkylsilyl group.

(b2)

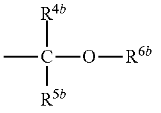

(b3)

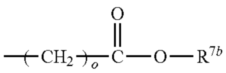

In the formulae (b2) and (b3), $R^{4b}$ and $R^{5b}$ each independently represent a hydrogen atom, or a linear or branched alkyl group having 1 to 6 carbon atoms, $R^{6b}$ represents a linear, branched or cyclic alkyl group having 1 to 10 carbon atoms, $R^{7b}$ represents a linear, branched or cyclic alkyl group having 1 to 6 carbon atoms, and $o$ represents 0 or 1.

Examples of the linear or branched alkyl group include a methyl group, an ethyl group, a propyl group, an isopropyl group, a n-butyl group, an isobutyl group, a tert-butyl group, a pentyl group, an isopentyl group, a neopentyl group, and the like. Also, examples of the cyclic alkyl group include a cyclopentyl group, a cyclohexyl group, and the like.

Specific examples of the acid-dissociative dissolution-controlling group represented by the formula (b2) include a methoxyethyl group, ethoxyethyl group, n-propoxyethyl group, isopropoxyethyl group, n-butoxyethyl group, isobutoxyethyl group, tert-butoxyethyl group, cyclohexyloxyethyl group, methoxypropyl group, ethoxypropyl group, 1-methoxy-1-methyl-ethyl group, 1-ethoxy-1-methylethyl group, and the like. Furthermore, specific examples of the acid-dissociative dissolution-controlling group represented by the formula (b3) include a tert-butoxycarbonyl group, tert-butoxycarbonylmethyl group, and the like. Examples of the trialkylsilyl group include a trimethylsilyl group and tri-tert-butyldimethylsilyl group in which each alkyl group has 1 to 6 carbon atoms.

[(B2) Polyhydroxystyrene Resin]

As the (B2) polyhydroxystyrene resin, a resin including the structural unit represented by the following formula (b4) may be used.

(b4)

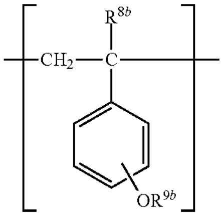

In the formula (b4), $R^{8b}$ represents a hydrogen atom or an alkyl group having 1 to 6 carbon atoms, and $R^{9b}$ represents an acid-dissociative dissolution-controlling group.

The alkyl group having 1 to 6 carbon atoms may include, for example, linear, branched or cyclic alkyl groups having 1 to 6 carbon atoms. Examples of the linear or branched alkyl group include a methyl group, ethyl group, propyl group, isopropyl group, n-butyl group, isobutyl group, tert-butyl group, pentyl group, isopentyl group and neopentyl group, and examples of the cyclic alkyl group include a cyclopentyl group and cyclohexyl group.

The acid-dissociative dissolution-controlling group represented by the above $R^{9b}$ may be similar to the acid-dissociative dissolution-controlling groups exemplified in terms of the above formulae (b2) and (b3).

Furthermore, the (B2) polyhydroxystyrene resin may include another polymerizable compound as a structural unit in order to moderately control physical or chemical properties. The polymerizable compound is exemplified by conventional radical polymerizable compounds and anion polymerizable compounds. Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid 2-methacryloyloxyethyl phthalic acid and 2-methacryloyloxyethyl hexahydrophthalic acid; (meth)acrylic acid alkyl esters such as methyl(meth)acrylate, ethyl(meth)acrylate and butyl(meth) acrylate; (meth)acrylic acid hydroxyalkyl esters such as 2-hydroxyethyl(meth)acrylate and 2-hydroxypropyl(meth) acrylate; (meth)acrylic acid aryl esters such as phenyl(meth) acrylate and benzyl(meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

[(B3) Acrylic Resin]

As described above, the photosensitive resin composition contains, as an essential ingredient, the (B-3) acrylic resin containing a constituent unit derived from an acrylic acid ester containing an —$SO_2$-containing cyclic group or a lactone-containing cyclic group. Therefore, as the (B3) acrylic resin, preferred is the (B-3) acrylic resin containing a constituent unit derived from an acrylic acid ester comprising an —$SO_2$-containing cyclic group or a lactone-containing cyclic group. Below, the (B-3) acrylic resin suitable as the (B3) acrylic resin will be described.

((B-3) Acrylic Resin)

The (B-3) acrylic resin comprises an —$SO_2$-containing cyclic group or a lactone-containing cyclic group. Therefore, the (B-3) acrylic resin comprises a constituent unit (b-3) comprising an —$SO_2$-containing cyclic group or a lactone-containing cyclic group as an essential ingredient.

In this case, the "—$SO_2$-containing cyclic group" refers to a cyclic group having a cyclic group containing a ring comprising —$SO_2$— in the ring backbone thereof, specifically a cyclic group in which the sulfur atom (S) in —$SO_2$— forms a part of the ring backbone of the cyclic group. Considering a ring comprising —$SO_2$— in the ring backbone thereof as the first ring, a group having that ring alone is called a monocyclic group, and a group further having another ring structure is called a polycyclic group regardless of its structure. The —$SO_2$-containing cyclic group may be monocyclic or polycyclic.

In particular, the —$SO_2$-containing cyclic group is preferably a cyclic group containing —O—$SO_2$— in the ring backbone thereof, i.e., a cyclic group containing a sultone ring in which —O—S— in —O—$SO_2$— forms a part of the ring backbone.

The number of carbon atoms in an —$SO_2$-containing cyclic group is preferably 3 to 30, more preferably 4 to 20, even more preferably 4 to 15, and in particular preferably 4 to 12. The above number of carbon atoms is the number of carbon atoms constituting a ring backbone, and shall not include the number of carbon atoms in a substituent.

The —$SO_2$-containing cyclic group may be an —$SO_2$-containing aliphatic cyclic group or an —$SO_2$-containing aromatic cyclic group. It is preferably an —$SO_2$-containing aliphatic cyclic group.

—$SO_2$-containing aliphatic cyclic groups include a group in which at least one hydrogen atom is removed from an aliphatic hydrocarbon ring where a part of the carbon atoms constituting the ring backbone thereof is(are) substituted with —$SO_2$— or —O—$SO_2$. More specifically, they include a group in which at least one hydrogen atom is removed from an aliphatic hydrocarbon ring where —$CH_2$— constituting the ring backbone thereof is substituted with —$SO_2$— and a group in which at least one hydrogen atom is removed from an aliphatic hydrocarbon ring where —$CH_2$—$CH_2$— constituting the ring backbone thereof is substituted with —O—$SO_2$—.

The number of carbon atoms in the above alicyclic hydrocarbon ring is preferably 3 to 20, more preferably 3 to 12. The above alicyclic hydrocarbon ring may be polycyclic, or may be monocyclic. As the monocyclic alicyclic hydrocarbon group, preferred is a group in which two hydrogen atoms are removed from monocycloalkane having 3 to 6 carbon atoms. Examples of the above monocycloalkane can include cyclopentane, cyclohexane and the like. As the polycyclic alicyclic hydrocarbon ring, preferred is a group in which two hydrogen atoms are removed from polycycloalkane having 7 to 12 carbon atoms, and specific examples of the above polycycloalkane include adamantane, norbornane, isobornane, tricyclodecane, tetracyclododecane and the like.

The —$SO_2$-containing cyclic group may have a substituent. Examples of the above substituent include, for example, an alkyl group, an alkoxy group, a halogen atom, a halogenated alkyl group, a hydroxy group, an oxygen atom (═O), —COOR", —OC(═O)R", a hydroxyalkyl group, a cyano group and the like.

For an alkyl group as the above substituent, preferred is an alkyl group having 1 to 6 carbon atoms. The above alkyl group is preferably linear or branched. Specific examples include a methyl group, an ethyl group, an n-propyl group, an isopropyl group, an n-butyl group, an isobutyl group, a tert-butyl group, an n-pentyl group, an isopentyl group, a neopentyl group, an n-hexyl group and the like. Among these, a methyl group or an ethyl group is preferred, and in particular a methyl group is preferred.

For an alkoxy group as the above substituent, preferred is an alkoxy group having 1 to 6 carbon atoms. The above alkoxy group is preferably linear or branched. Specific examples include a group in which an alkyl groups recited as an alkyl group for the above substituent is attached to the oxygen atom (—O—).

Halogen atoms as the substituent include a fluorine atom, a chlorine atom, a bromine atom, an iodine atom and the like, and a fluorine atom is preferred.

Halogenated alkyl groups for the above substituent include a group in which a part or all of the hydrogen atoms in the above alkyl group is(are) substituted with the above halogen atom(s).

Halogenated alkyl groups as the above substituent include a group in which a part or all of the hydrogen atoms in the alkyl groups recited as an alkyl group for the above substituent is(are) substituted with the above halogen atom(s). As the above halogenated alkyl group, a fluorinated alkyl group is preferred, and a perfluoroalkyl group is particularly preferred.

R"s in the aforementioned —COOR" and —OC(═O)R" are either a hydrogen atom or a linear, branched or cyclic alkyl group having 1 to 15 carbon atoms.

In a case where R" is a linear or branched alkyl group, the number of carbon atoms in the above chain alkyl group is preferably 1 to 10, more preferably 1 to 5, and in particular preferably 1 or 2.

In a case where R" is a cyclic alkyl group, the number of carbon atoms in the above cyclic alkyl group is 3 to 15, more preferably 4 to 12, and in particular preferably 5 to 10. Specific examples can include a group in which one or more hydrogen atoms are removed from monocycloalkane; and polycycloalkane such as bicycloalkane, tricycloalkane, tetracycloalkane, which are optionally substituted with a fluorine atom or a fluorinated alkyl group. More specific examples include a group in which one or more hydrogen atoms are removed from monocycloalkane such as cyclopentane and cyclohexane; and polycycloalkane such as adamantane, norbornane, isobornane, tricyclodecane and tetracyclododecane.

For a hydroxyalkyl group as the above substituent, preferred is a hydroxyalkyl group having 1 to 6 carbon atoms. Specific examples include a group in which at least one of the hydrogen atoms in the alkyl groups recited as an alkyl group for the above substituent is substituted with a hydroxy group.

More specific examples of the —$SO_2$-containing cyclic group include the groups represented by the following formulae (3-1) to (3-4).

(3-1)

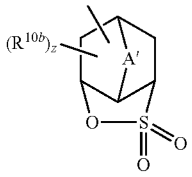

(3-2)

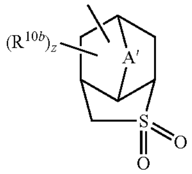

(3-3)

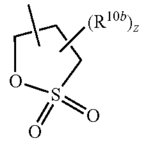

(3-4)

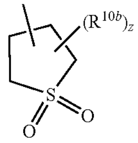

(In the formulae, A' represents an alkylene group having 1 to 5 carbon atoms optionally comprising an oxygen atom or a sulfur atom, an oxygen atom or a sulfur atom; z represents an integer of 0 to 2; $R^{10b}$ represents an alkyl group, an alkoxy group, a halogenated alkyl group, a hydroxy group, —COOR", —OC(═O)R", a hydroxyalkyl group, or a cyano group; and R" represents a hydrogen atom or an alkyl group.)

In the above formulae (3-1) to (3-4), A' represents an alkylene group having 1 to 5 carbon atoms optionally comprising an oxygen atom (—O—) or a sulfur atom (—S—), an oxygen atom or a sulfur atom. As an alkylene group having 1 to 5 carbon atoms in A', a linear or branched alkylene group is preferred, including a methylene group, an ethylene group, an n-propylene group, an isopropylene group and the like.

In a case where the above alkylene group comprises an oxygen atom or a sulfur atom, specific examples thereof include a group in which —O— or —S— is present at a terminal or between carbon atoms of the above alkylene group, for example, —O—$CH_2$—, —$CH_2$—O—$CH_2$—, —S—$CH_2$—, —$CH_2$—S—$CH_2$—, and the like. As A', an alkylene group having 1 to 5 carbon atoms or —O— is preferred, and an alkylene group having 1 to 5 carbon atoms is more preferred, and a methylene group is most preferred.

z may be any of 0 to 2, and is most preferably 0. In a case where z is 2, more than one $R^{10b}$ may be the same, or may differ from each other.

Examples of an alkyl group, an alkoxy group, a halogenated alkyl group, —COOR", —OC(═O)R" and a hydroxyalkyl group in $R^{10b}$ include those similar to the groups described for the alkyl group, the alkoxy group, the halogenated alkyl group, —COOR", —OC(═O)R" and the hydroxyalkyl group, respectively, which are recited as a substituent optionally contained in the —$SO_2$-containing cyclic group.

Below, specific cyclic groups represented by the above formulae (3-1) to (3-4) will be illustrated. Note that "Ac" in the formulae represents an acetyl group.

(3-1-1)

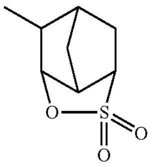

(3-1-2)

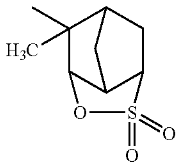

(3-1-3)

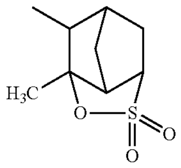

(3-1-4)

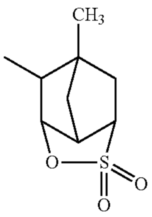

(3-1-5)

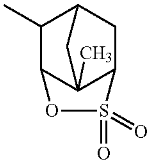

(3-1-6)

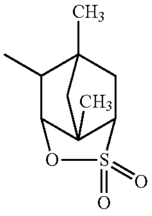

(3-1-7)

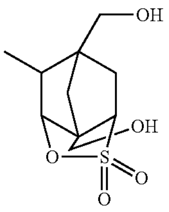

-continued
(3-1-8)
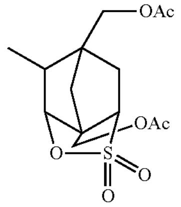
(3-1-9)
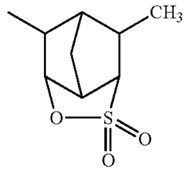
(3-1-10)
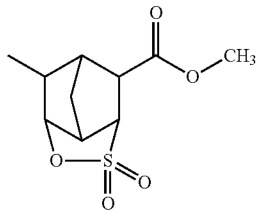
(3-1-11)
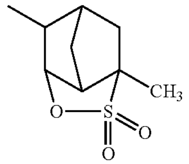
(3-1-12)
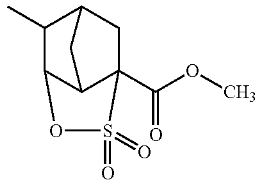
(3-1-13)
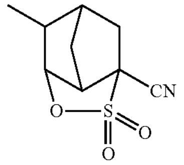
(3-1-14)
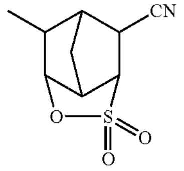
(3-1-15)
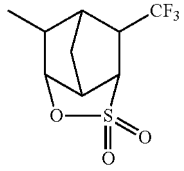
-continued
(3-1-16)
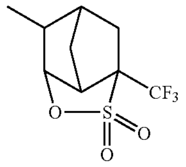
(3-1-17)
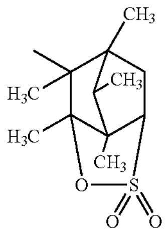
(3-1-18)
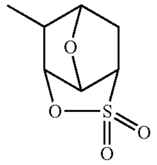
(3-1-19)
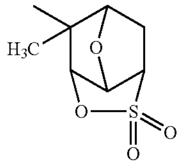
(3-1-20)
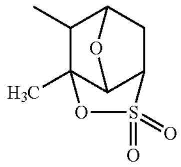
(3-1-21)
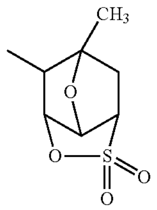
(3-1-22)
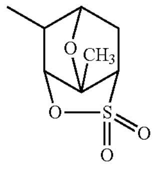
(3-1-23)
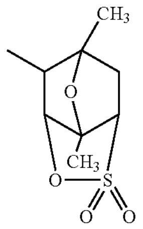

-continued (3-1-24)

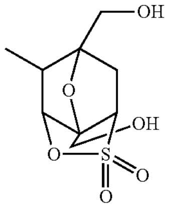

(3-1-25)

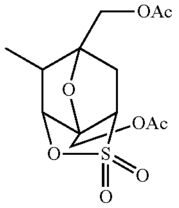

(3-1-26)

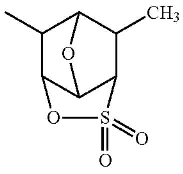

(3-1-27)

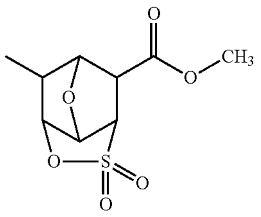

(3-1-28)

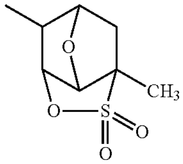

(3-1-29)

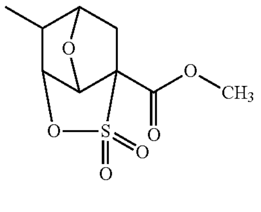

(3-1-30)

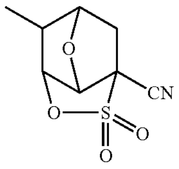

(3-1-31)

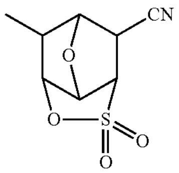

-continued (3-1-32)

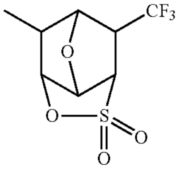

(3-1-33)

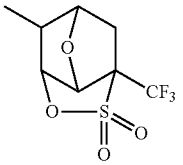

(3-2-1)

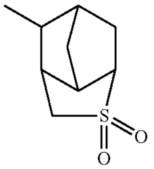

(3-2-2)

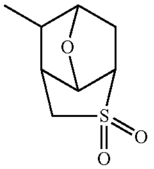

(3-3-1)

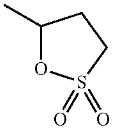

(3-4-1)

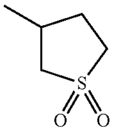

As the —$SO_2$-containing cyclic group, among those shown above, a group represented by the above formula (3-1) is preferred, and at least one selected from the group consisting of the groups represented by any of the aforementioned formulae (3-1-1), (3-1-18), (3-3-1) and (3-4-1) is more preferred, and a group represented by the aforementioned formula (3-1-1) is most preferred.

The "lactone-containing cyclic group" refers to a cyclic group containing a ring (lactone ring) comprising —O—C(═O)— in the ring backbone thereof. Considering the lactone ring as the first ring, a group having that lactone ring alone is called a monocyclic group, and a group further having another ring structure is called a polycyclic group regardless of its structure. The lactone-containing cyclic group may be a monocyclic group, or may be a polycyclic group.

There is no particular limitation on the lactone cyclic group in the constituent unit (b-3), and any can be used. Specifically, lactone-containing monocyclic groups include a group in which one hydrogen atom is removed from 4 to 6 membered ring lactone, a group in which one hydrogen atom is removed from, for example, β-propiono lactone, a group in which one hydrogen atom is removed from, γ-butyrolactone, a group in which one hydrogen atom is removed from δ-valerolactone and the like. Further, lactone-containing polycyclic groups include a group in which one hydrogen atom is removed from bicycloalkane, tricycloalkane and tetracycloalkane having a lactone ring.

There is no particular limitation on the structures in other part in the constituent unit (b-3) as long as it has an $—SO_2$-containing cyclic group or a lactone-containing cyclic group. However, preferred is at least one constituent unit selected from the group consisting of a constituent unit (b-3-S) derived from an acrylic acid ester comprising an $—SO_2$-containing cyclic group in which the hydrogen atom attached to the carbon atom in the a position is optionally substituted with a substituent; and a constituent unit (b-3-L) derived from an acrylic acid ester comprising a lactone-containing cyclic group in which the hydrogen atom attached to the carbon atom in the a position is optionally substituted with a substituent.

[Constituent Unit (b-3-S)]

More specifically, examples of the constituent unit (b-3-S) include one represented by the following formula (b-S1).

(b-S1)

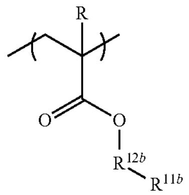

(In the formula, R represents a hydrogen atom, an alkyl group having 1 to 5 carbon atoms or a halogenated alkyl group having 1 to 5 carbon atoms; and $R^{11b}$ represents an $—SO_2$-containing cyclic group; and $R^{12b}$ represents a single-bond or divalent linking group.)

In the formula (b-S1), R is similarly defined as above.

$R^{11b}$ is similarly defined as in the $—SO_2$-containing cyclic group described above.

$R^{12b}$ may be either a single-bond linking group or a divalent linking group. A divalent linking group is preferred due to the superior effect of the present invention.

There is no particular limitation on the divalent linking group in $R^{12b}$, but suitable groups include a divalent hydrocarbon group optionally having a substituent, a divalent linking group comprising a hetero atom and the like.

(Divalent Hydrocarbon Group Optionally Having Substituent)

The hydrocarbon group as a divalent linking group may be an aliphatic hydrocarbon group, or may be an aromatic hydrocarbon group. The aliphatic hydrocarbon group means a hydrocarbon group without aromaticity. The above aliphatic hydrocarbon group may be saturated or may be unsaturated. Usually, a saturated hydrocarbon group is preferred. More specifically, examples of the above aliphatic hydrocarbon group include a linear or branched aliphatic hydrocarbon group, an aliphatic hydrocarbon group comprising a ring in the structure thereof and the like.

The number of carbon atoms in the linear or branched aliphatic hydrocarbon group is preferably 1 to 10, more preferably 1 to 8, and even more preferably 1 to 5.

As the linear aliphatic hydrocarbon group, a linear alkylene group is preferred. Specific examples include a methylene group [$—CH_2—$], an ethylene group [$—(CH_2)_2—$], a trimethylene group [$—(CH_2)_3—$], a tetramethylene group [$—(CH_2)_4—$], a pentamethylene group [$—(CH_2)_5—$] and the like.

As the branched aliphatic hydrocarbon group, a branched alkylene group is preferred. Specific examples include alkyl alkylene groups such as alkyl methylene groups such as $—CH(CH_3)—$, $—CH(CH_2CH_3)—$, $—C(CH_3)_2—$, $—C(CH_3)(CH_2CH_3)—$, $—C(CH_3)(CH_2CH_2CH_3)—$ and $—C(CH_2CH_3)_2—$; alkyl ethylene groups such as $—CH(CH_3)CH_2—$, $—CH(CH_3)CH(CH_3)—$, $—C(CH_3)_2CH_2—$, $—CH(CH_2CH_3)CH_2—$ and $—C(CH_2CH_3)_2—CH_2—$; alkyl trimethylene groups such as $—CH(CH_3)CH_2CH_2—$ and $—CH_2CH(CH_3)CH_2—$; alkyl tetramethylene groups such as $—CH(CH_3)CH_2CH_2CH_2—$ and $—CH_2CH(CH_3)CH_2CH_2—$; and the like. As an alkyl group in the alkyl alkylene group, a linear alkyl group having 1 to 5 carbon atoms is preferred.

The above linear or branched aliphatic hydrocarbon group may or may not have a substituent (a group or atom other than a hydrogen atom) which substitutes a hydrogen atom. Examples of the substituent include a fluorine atom, a fluorinated alkyl group having 1 to 5 carbon atoms substituted with a fluorine atom, an oxo group (=O) and the like.

Examples of the above aliphatic hydrocarbon group comprising a ring in the structure thereof include a cyclic aliphatic hydrocarbon group optionally comprising a hetero atom in the structure (a group in which two hydrogen atoms are removed from an aliphatic hydrocarbon ring); a group in which the above cyclic aliphatic hydrocarbon group is attached to an end of a linear or branched aliphatic hydrocarbon group; a group in which the above cyclic aliphatic hydrocarbon group is present in a linear or branched aliphatic hydrocarbon group along the chain; and the like. Examples of the above linear or branched aliphatic hydrocarbon group include those similar to the above.

The number of carbon atoms in the cyclic aliphatic hydrocarbon group is preferably 3 to 20, more preferably 3 to 12.

The cyclic aliphatic hydrocarbon group may be polycyclic, or may be monocyclic. As the monocyclic aliphatic hydrocarbon group, a group in which two hydrogen atoms are removed from monocycloalkane is preferred. The number of carbon atoms in the above monocycloalkane is preferably 3 to 6. Specific examples include cyclopentane, cyclohexane and the like. As the polycyclic aliphatic hydrocarbon group, a group in which two hydrogen atoms are removed from polycycloalkane is preferred. The number of carbon atoms in the above polycycloalkane is preferably 7 to 12. Specific examples include adamantane, norbornane, isobornane, tricyclodecane, tetracyclododecane and the like.

The cyclic aliphatic hydrocarbon group may or may not have a substituent which substitutes a hydrogen atom (a group or atom other than a hydrogen atom). Examples of the above substituent include an alkyl group, an alkoxy group, a halogen atom, a halogenated alkyl group, a hydroxy group, an oxo group (=O) and the like.

For an alkyl group as the above substituent, an alkyl group having 1 to 5 carbon atoms is preferred, and a methyl group, an ethyl group, a propyl group, an n-butyl group and a tert-butyl group are more preferred.

For an alkoxy group as the above substituent, an alkoxy group having 1 to 5 carbon atoms is preferred, and a methoxy group, an ethoxy group, an n-propoxy group, an iso-propoxy group, an n-butoxy group and a tert-butoxy group are more preferred, and a methoxy group and an ethoxy group are particularly preferred.

Halogen atoms as the above substituent include a fluorine atom, a chlorine atom, a bromine atom, an iodine atoms and the like, and a fluorine atom is preferred.

Halogenated alkyl groups as the above substituent include a group in which a part or all of hydrogen atoms in the aforementioned alkyl group is(are) substituted with the above halogen atom(s).

In the cyclic aliphatic hydrocarbon group, a part of carbon atoms constituting the ring structure thereof may be substituted with —O— or —S—. As the substituent comprising the above hetero atom, preferred are —O—, —C(═O)—O—, —S—, —S(═O)$_2$— and —S(═O)$_2$—O—.

The aromatic hydrocarbon group as the divalent hydrocarbon group is a divalent hydrocarbon group having at least one aromatic ring, and may have a substituent. There is no particular limitation on the aromatic ring as long as it is an cyclic conjugated system having a 4n+2 n electrons, and it may be monocyclic or may be polycyclic. The number of carbon atoms in the aromatic ring is preferably 5 to 30, more preferably 5 to 20, even more preferably 6 to 15, and in particular preferably 6 to 12, provided that the number of carbon atoms in a substituent shall not be included in the above number of carbon atoms.

Specifically, aromatic rings include aromatic hydrocarbon rings such as benzene, naphthalene, anthracene and phenanthrene; aromatic heterocycles in which a part of the carbon atoms constituting the above aromatic hydrocarbon ring is(are) substituted with hetero atom(s). Hetero atoms in the aromatic heterocycle include an oxygen atom, a sulfur atom, a nitrogen atom and the like. Specifically, aromatic heterocycles include a pyridine ring, a thiophene ring and the like.

Specific examples of the aromatic hydrocarbon group as a divalent hydrocarbon group include a group in which two hydrogen atoms are removed from the above aromatic hydrocarbon ring or the above aromatic heterocycle (an arylene group or a heteroarylene group); a group in which two hydrogen atoms are removed from an aromatic compound comprising two or more aromatic rings (for example, biphenyl, fluorene and the like); a group in which one hydrogen atom from a group where one hydrogen atom is removed from the above aromatic hydrocarbon ring or the above aromatic heterocycle (an aryl group or a heteroaryl group) is substituted with an alkylene group (for example, a group in which one hydrogen atom is further removed from an aryl group in an arylalkyl group such as a benzyl group, a phenethyl group, a 1-naphthylmethyl group, a 2-naphthylmethyl group, a 1-naphthylethyl group and a 2-naphthylethyl group); and the like.

The number of carbon atoms in the above alkylene group attached to an aryl group or a heteroaryl group is preferably 1 to 4, more preferably 1 to 2, and in particular preferably 1.

In the above aromatic hydrocarbon group, a hydrogen atom of the above aromatic hydrocarbon group may be substituted with a substituent. For example, a hydrogen atom attached to an aromatic ring in the above aromatic hydrocarbon group may be substituted with a substituent. Examples of the substituent include an alkyl group, an alkoxy group, a halogen atom, a halogenated alkyl group, a hydroxy group, an oxo group (═O) and the like.

For an alkyl group as the above substituent, an alkyl group having 1 to 5 carbon atoms is preferred, and a methyl group, an ethyl group, an n-propyl group, an n-butyl group and a tert-butyl group are more preferred.

For an alkoxy group as the above substituent, an alkoxy group having 1 to 5 carbon atoms is preferred, and a methoxy group, an ethoxy group, an n-propoxy group, an iso-propoxy group, an n-butoxy group and a tert-butoxy group are preferred, and a methoxy group and an ethoxy group are more preferred.

Halogen atoms as the above substituent include a fluorine atom, a chlorine atom, a bromine atom, an iodine atom and the like, and a fluorine atom is preferred.

Halogenated alkyl groups as the above substituent include a group in which a part or all of hydrogen atoms in the aforementioned alkyl group is(are) substituted with the above halogen atom(s).

(Divalent Linking Group Comprising Hetero Atom)

A hetero atom in the divalent linking group comprising a hetero atom is an atom other than a carbon atom and a hydrogen atom, including, for example, an oxygen atom, a nitrogen atom, a sulfur atom, a halogen atom and the like.

Specific examples of the divalent linking group comprising a hetero atom include non-hydrocarbon based linking groups such as —O—, —C(═O)—, —C(═O)—O—, —O—C(═O)—O—, —S—, —S(═O)$_2$—, —S(═O)$_2$—O—, —NH—, —NH—C(═O)—, —NH—C(═NH)—, ═N—, and combinations of at least one of these non-hydrocarbon based linking groups and a divalent hydrocarbon group and the like. Examples of the above divalent hydrocarbon group include those similar to the aforementioned divalent hydrocarbon groups optionally having a substituent, and linear or branched aliphatic hydrocarbon groups are preferred.

Among those described above, —NH— in —C(═O)—NH—, and H in —NH— and —NH—C(═NH)— may be substituted with a substituent such as an alkyl group or an acyl group, respectively. The number of carbon atoms in the above substituent is preferably 1 to 10, more preferably 1 to 8, and in particular preferably 1 to 5.

As a divalent linking group in $R^{12b}$, a linear or branched alkylene group, an cyclic aliphatic hydrocarbon group or a divalent linking group comprising a hetero atom is particularly preferred.

In a case where the divalent linking group in $R^{12b}$ is a linear or branched alkylene group, the number of carbon atoms in the above alkylene group is preferably 1 to 10, more preferably 1 to 6, in particular preferably 1 to 4, and most preferably 1 to 3. Specific examples include those similar to the linear alkylene groups or branched alkylene groups recited as a linear or branched aliphatic hydrocarbon group in the description of the "divalent hydrocarbon group optionally having a substituent" as the aforementioned divalent linking group.

In a case where the divalent linking group in $R^{12b}$ is an cyclic aliphatic hydrocarbon group, examples of the above cyclic aliphatic hydrocarbon group include those similar to the cyclic aliphatic hydrocarbon groups recited as the "aliphatic hydrocarbon group comprising a ring in the structure" in the description of the "divalent hydrocarbon group optionally having a substituent" as the aforementioned divalent linking group.

As the above cyclic aliphatic hydrocarbon group, particularly preferred is a group in which two or more hydrogen atoms are removed from cyclopentane, cyclohexane, norbornane, isobornane, adamantane, tricyclodecane or tetracyclododecane.

In a case where the divalent linking group in $R^{12b}$ is a divalent linking group comprising a hetero atom, those preferred as the above linking groups include —O—, —C(═O)—O—, —C(═O)—, —O—C(═O)—O—, —C(═O)—NH—, —NH—(H may be substituted with a substituent such as an alkyl group or an acyl group), —S—, —S(═O)$_2$—, —S(═O)$_2$—O— and a group represented by the formula $-Y^1-O-Y^2-$, $-[Y^1-C(=O)-O]_{m'}-Y^2-$ or $-Y^1-O-C(=O)-Y_2-$ (wherein $Y^1$ and $Y^2$ are divalent hydrocarbon groups each independently, optionally having a substituent, and O represents an oxygen atom, and m' is an integer of 0 to 3).

In a case where the divalent linking group in $R^{12b}$ is —NH—, the hydrogen atom in —NH— may be substituted with a substituent such as an alkyl group or an acyl group. The number of carbon atoms in the above substituent (an alkyl group, an acyl group and the like) is preferably 1 to 10, more preferably 1 to 8, and in particular preferably 1 to 5.

$Y^1$ and $Y^2$ in the formula $Y^1-O-Y^2-$, $-[Y^1-C(=O)-O]_{m'}-Y^2-$ or $-Y^1-O-C(=O)-Y^2-$ are divalent hydrocarbon groups each independently, optionally having a substituent. Examples of the above divalent hydrocarbon group include those similar to the "divalent hydrocarbon group optionally having a substituent" recited in the description of the above divalent linking group.

As $Y^1$, a linear aliphatic hydrocarbon group is preferred, and a linear alkylene group is more preferred, and a linear alkylene group having 1 to 5 carbon atoms is more preferred, and a methylene group and an ethylene group are particularly preferred.

As $Y^2$, a linear or branched aliphatic hydrocarbon group is preferred, and a methylene group, an ethylene group and an alkylmethylene group are more preferred. The alkyl group in the above alkylmethylene group is preferably a linear alkyl group having 1 to 5 carbon atoms, more preferably a linear alkyl group having 1 to 3 carbon atoms, and in particular preferably a methyl group.

In a group represented by the formula $-[Y^1-C(=O)-O]_{m'}-Y^2-$, m' is an integer of 0 to 3, preferably an integer of 0 to 2, more preferably 0 or 1, and in particular preferably 1. That is, as a group represented by the formula $-[Y^1-C(=O)-O]_{m'}-Y^2-$, a group represented by the formula $-Y^1-C(=O)-O-Y^2-$ is particularly preferred. Among these, a group represented by the formula $-(CH_2)_{a'}-C(=O)-O-(CH_2)_{b'}-$ is preferred. In the above formula, a' is an integer of 1 to 10, preferably an integer of 1 to 8, more preferably an integer of 1 to 5, even more preferably 1 or 2, and most preferably 1. b' is an integer of 1 to 10, preferably an integer of 1 to 8, more preferably an integer of 1 to 5, even more preferably 1 or 2, and most preferably 1.

With regard to the divalent linking group in $R^{12b}$, an organic group comprising a combination of at least one non-hydrocarbon group and a divalent hydrocarbon group is preferred as the divalent linking group comprising a hetero atom. Among these, a linear chain group having an oxygen atom as a hetero atom, for example, a group comprising an ether bond or an ester bond is preferred, and a group represented by the formula $-Y^1-O-Y^2-$, $-[Y^1-C(=O)-O]_{m'}-Y^2-$ or $-Y^1-O-C(=O)-Y^2-$ is more preferred, and a group represented by the above formula $-[Y^1-C(=O)-O]_{m'}-Y^2-$ or $-Y^1-O-C(=O)-Y^2-$ is particularly preferred.

As the divalent linking group in $R^{12b}$, one comprising an alkylene group or an ester bond (—C(=O)—O—) is preferred.

The above alkylene group is preferably a linear or branched alkylene group. Suitable examples of the above linear aliphatic hydrocarbon group include a methylene group [$-CH_2-$], an ethylene group [$-(CH_2)_2-$], a trimethylene group [$-(CH_2)_3-$], a tetramethylene group [$-(CH_2)_4-$], a pentamethylene group [$-(CH_2)_5-$] and the like. Suitable examples of the above branched alkylene group include alkyl alkylene groups such as alkyl methylene groups such as $-CH(CH_3)-$, $-CH(CH_2CH_3)-$, $-C(CH_3)_2-$, $-C(CH_3)(CH_2CH_3)-$, $-C(CH_3)(CH_2CH_2CH_3)-$ and $-C(CH_2CH_3)_2-$; alkyl ethylene groups such as $-CH(CH_3)CH_2-$, $-CH(CH_3)CH(CH_3)-$, $-C(CH_3)_2CH_2-$, $-CH(CH_2CH_3)CH_2-$ and $-C(CH_2CH_3)_2-CH_2-$; alkyl trimethylene groups such as $-CH(CH_3)CH_2CH_2-$ and $-CH_2CH(CH_3)CH_2-$; alkyl tetramethylene groups such as $-CH(CH_3)CH_2CH_2CH_2-$ and $-CH_2CH(CH_3)CH_2CH_2-$.

As the divalent linking group comprising an ester bond, particularly preferred is a group represented by the formula: $-R^{13b}-C(=O)-O-$ [wherein $R^{13b}$ represents a divalent linking group.]. That is, the constituent unit (b-3-S) is preferably one represented by the following formula (b-S1-1).

(b-S1-1)

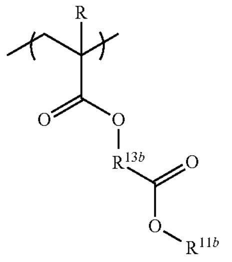

(In the formula, R and $R^{11b}$ are each similar to the above, and $R^{13b}$ represents a divalent linking group.)

There is no particular limitation for $R^{13b}$, including, for example, those similar to the aforementioned divalent linking group in $R^{12b}$.

As the divalent linking group in $R^{13b}$, a linear or branched alkylene group, an aliphatic hydrocarbon group comprising a ring in the structure, or a divalent linking group comprising a hetero atom is preferred, and a linear or branched alkylene group or a divalent linking group comprising an oxygen atom as a hetero atom is preferred.

As the linear alkylene group, a methylene group or an ethylene group is preferred, and a methylene group is particularly preferred. As the branched alkylene group, an alkylmethylene group or an alkylethylene group is preferred, and $-CH(CH_3)-$, $-C(CH_3)_2-$ or $-C(CH_3)_2CH_2-$ is particularly preferred.

As the divalent linking group comprising an oxygen atom, a divalent linking group comprising an ether bond or an ester bond is preferred, and the aforementioned $-Y^1-O-Y^2-$, $-[Y^1-C(=O)-O]_{m'}-Y^2-$ or $-Y^1-O-C(=O)-Y^2-$ is more preferred. $Y^1$ and $Y^2$ are each independently divalent hydrocarbon groups optionally having a substituent, and m' is an integer of 0 to 3. Among these, $-Y^1-O-C(=O)-Y^2-$ is preferred, and a group represented by $-(CH_2)_c-O-C(=O)-(CH_2)_d-$ is particularly preferred. c is an integer of 1 to 5, and 1 or 2 is preferred. d is an integer of 1 to 5, and 1 or 2 is preferred.

As the constituent unit (b-3-S), in particular, one represented by the following formula (b-S1-11) or (b-S1-12) is preferred, and one represented by the formula (b-S1-12) is more preferred.

(b-S1-11)

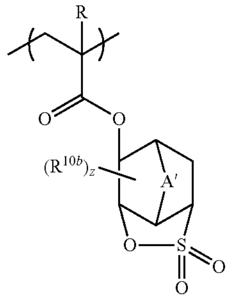

(b-S1-12)

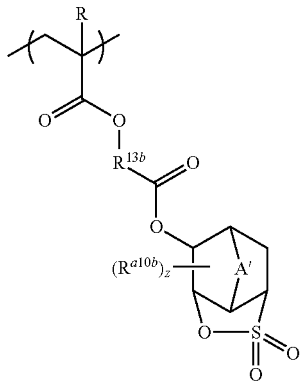

(In the formulae, R, A', $R^{10b}$, z and $R^{13b}$ are each the same as the above.)

In the formula (b-S1-11), A' is preferably a methylene group, an oxygen atom (—O—) or a sulfur atom (—S—).

As $R^{13b}$, preferred is a linear or branched alkylene group or a divalent linking group comprising an oxygen atom. Examples of the linear or branched alkylene group and the divalent linking group comprising an oxygen atom in $R^{13b}$ include those similar to the aforementioned linear or branched alkylene group and the aforementioned divalent linking group comprising an oxygen atom, respectively.

As the constituent unit represented by the formula (b-S1-12), particularly preferred is one represented by the following formula (b-S1-12a) or (b-S1-12b).

(b-S1-12a)

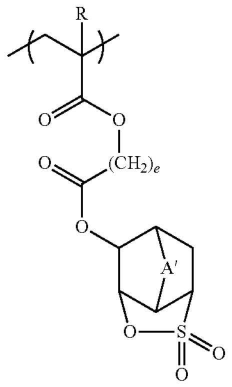

-continued (b-S1-12b)

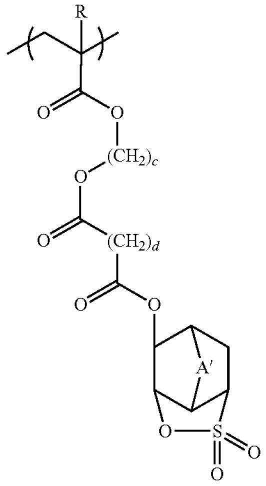

(In the formulae, R and A' are each the same as the above, and c to e are each independently an integer of 1 to 3.)

[Constituent Unit (b-3-L)]

Examples of the constituent unit (b-3-L) include, for example, those in which $R^{11b}$ in the aforementioned formula (b-S1) is substituted with a lactone-containing cyclic group, and more specifically include those represented by the following formulae (b-L1) to (b-L5).

(b-L1)

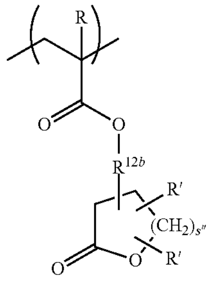

(b-L2)

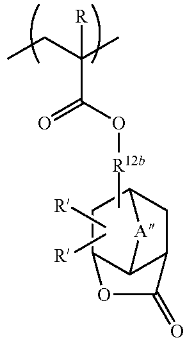

-continued (b-L3)

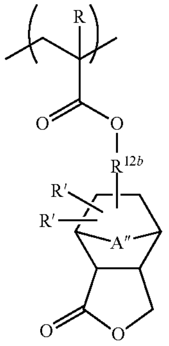

(b-L4)

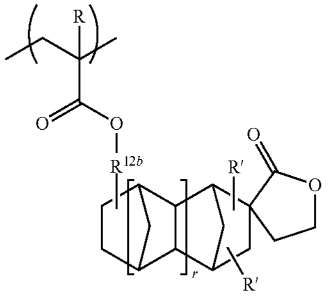

(b-L5)

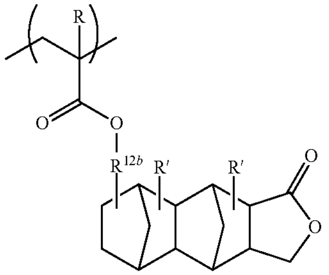

(In the formulae, R represents a hydrogen atom, an alkyl group having 1 to 5 carbon atoms or a halogenated alkyl group having 1 to 5 carbon atoms; R' represents each independently a hydrogen atom, an alkyl group, an alkoxy group, a halogenated alkyl group, a hydroxy group, —COOR", —OC(═O)R", a hydroxyalkyl group or a cyano group, and R" represents a hydrogen atom or an alkyl group; $R^{12b}$ represents a single bond or divalent linking group, and s" is an integer of 0 to 2; A" represents an alkylene group having 1 to 5 carbon atoms optionally comprising an oxygen atom or a sulfur atom, an oxygen atom or a sulfur atom; and r is 0 or 1.)

R in the formulae (b-L1) to (b-L5) is the same as the above.

Examples of the alkyl group, the alkoxy group, the halogenated alkyl group, —COOR", —OC(═O)R" and the hydroxyalkyl group in R' include those similar to the alkyl group, the alkoxy group, the halogenated alkyl group, —COOR", —OC(═O)R" and the hydroxyalkyl group recited as a substituent optionally contained in the —$SO_2$-containing cyclic group, respectively.

R' is preferably a hydrogen atom in view of easy industrial availability.

The alkyl group in R" may be any of a linear, branched or cyclic chain.

In a case where R" is a linear or branched alkyl group, the number of carbon atoms is preferably 1 to 10, more preferably 1 to 5.

In a case where R" is a cyclic alkyl group, the number of carbon atoms is preferably 3 to 15, more preferably 4 to 12, and most preferably 5 to 10. Specific examples include a group in which one or more hydrogen atoms are removed from monocycloalkane and polycycloalkane such as tricycloalkane and tetracycloalkane and the like optionally substituted with a fluorine atom or a fluorinated alkyl group. Specific examples include a group in which one or more hydrogen atoms are removed from monocycloalkane such as cyclopentane and cyclohexane; and polycycloalkane such as adamantane, norbornane, isobornane, tricyclodecane and tetracyclododecane; and the like.

Examples of A" include those similar to A' in the aforementioned formula (3-1). A" is preferably an alkylene group having 1 to 5 carbon atoms, an oxygen atom (—O—) or a sulfur atom (—S—), more preferably an alkylene group having 1 to 5 carbon atoms or —O—. As the alkylene group having 1 to 5 carbon atoms, a methylene group or a dimethylmethylene group is more preferred, and a methylene group is most preferred.

$R^{12b}$ is similar to $R^{12b}$ in the aforementioned formula (b-S1).

In the formula (b-L1), s" is preferably 1 to 2.

Below, specific examples of the constituent units represented by the aforementioned formulae (b-L1) to (b-L3) will be illustrated. In each of the following formulae, $R^{\alpha}$ represents a hydrogen atom, a methyl group or a trifluoromethyl group.

(b-L1-1)

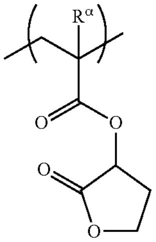

(b-L1-2)

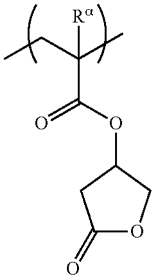

(b-L1-3)

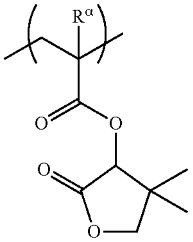

-continued
(b-L1-4)
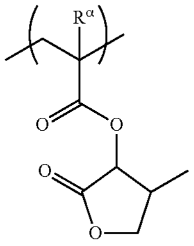
(b-L1-5)
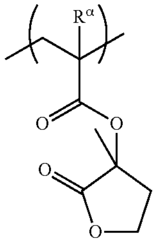
(b-L1-6)
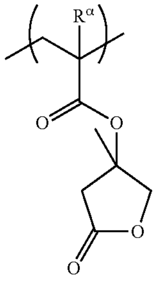
(b-L1-7)
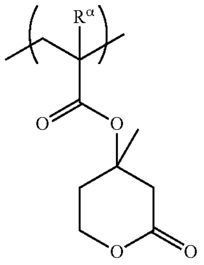
(b-L1-8)
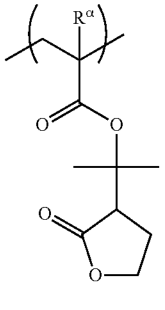
-continued
(b-L1-9)
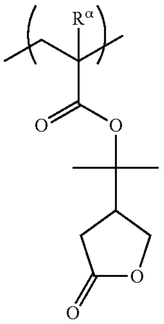
(b-L1-10)
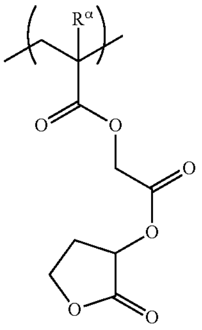
(b-L1-11)
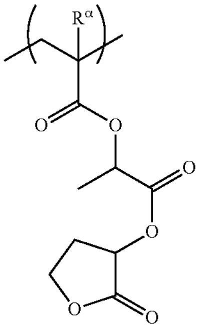
(b-L1-12)
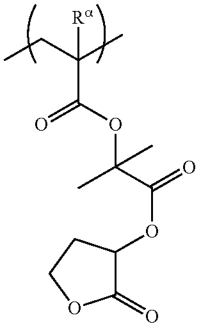

-continued
(b-L1-13)
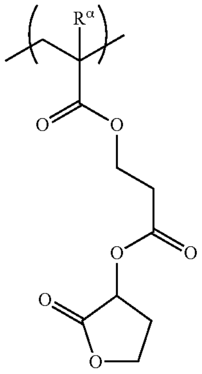
(b-L2-1)
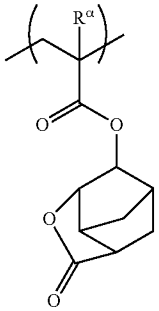
(b-L2-2)
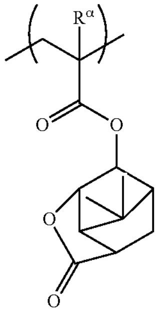
(b-L2-3)
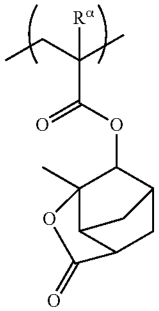
(b-L2-4)
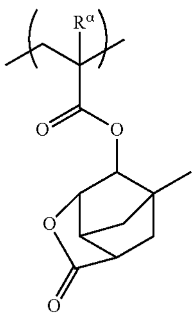
-continued
(b-L2-5)
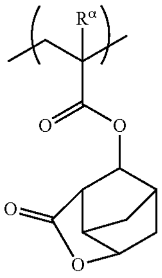
(b-L2-6)
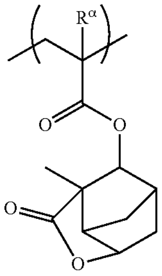
(b-L2-7)
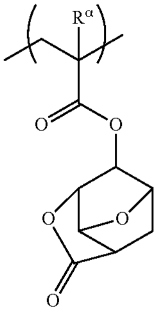
(b-L2-8)
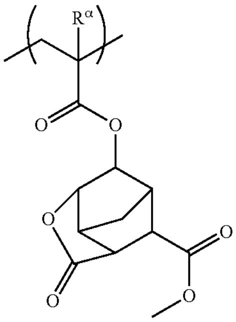
(b-L2-9)
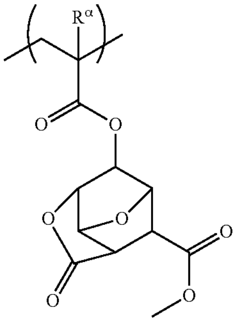

-continued
(b-L2-10)
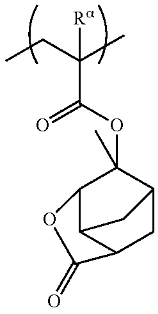
(b-L2-11)
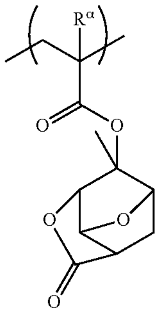
(b-L2-12)
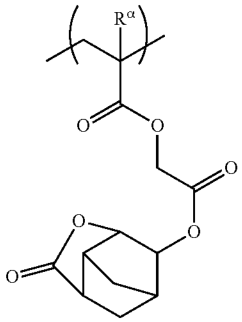
(b-L2-13)
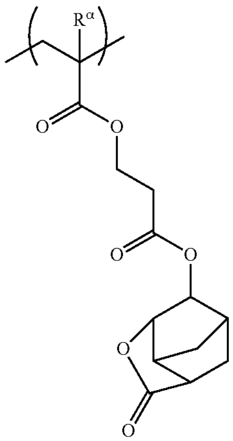
-continued
(b-L2-14)
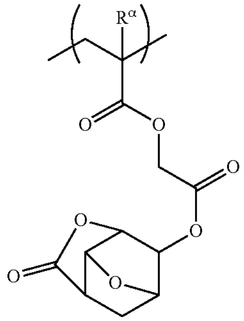
(b-L2-15)
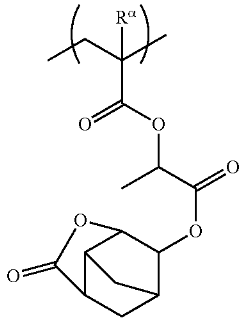
(b-L2-16)
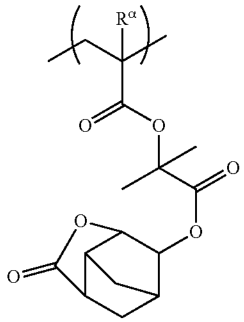
(b-L2-17)
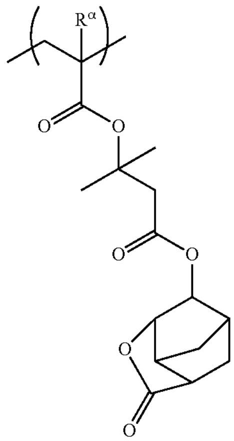

-continued (b-L3-1)

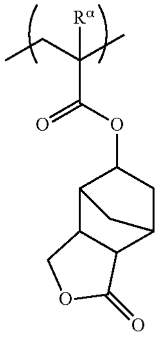

(b-L3-2)

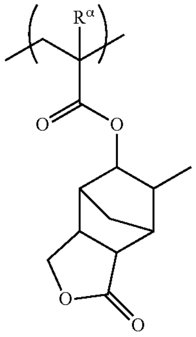

(b-L3-3)

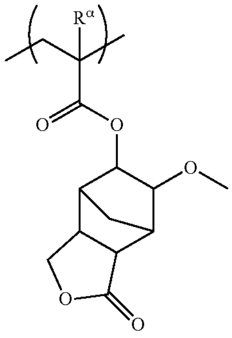

b-L3-4)

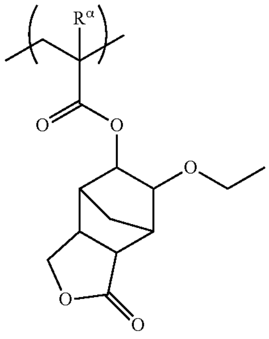

-continued (b-L3-5)

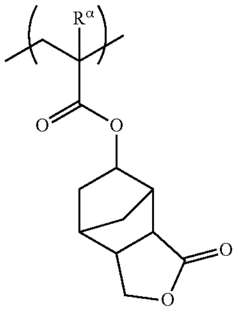

As the constituent unit (b-3-L), at least one selected from the group consisting of the constituent units represented by the aforementioned formulae (b-L1) to (b-L5) is preferred, and at least one selected from the group consisting of the constituent units represented by the formulae (b-L1) to (b-L3) is more preferred, and at least one selected from the group consisting of the constituent units represented by the aforementioned formula (b-L1) or (b-L3) is particularly preferred.

Among these, at least one selected from the group consisting of the constituent units represented by the aforementioned formulae (b-L1-1), (b-L1-2), (b-L2-1), (b-L2-7), (b-L2-12), (b-L2-14), (b-L3-1) and (b-L3-5) is preferred.

Further, as the constituent unit (b-3-L), the constituent units represented by following formulae (b-L6) to (b-L7) are also preferred.

(b-L6)

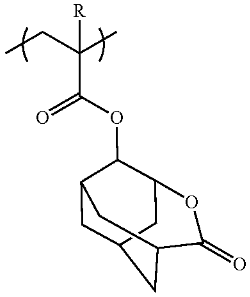

(b-L7)

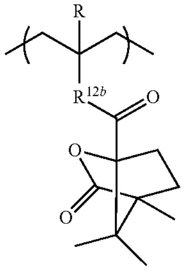

R and $R^{12b}$ in the formulae (b-L6) and (b-L7) are the same as the above.

Further, the acrylic resin (B-3) comprises a constituent unit represented by the following formulae (b5) to (b7) having an acid-dissociative group as a constituent unit which can enhance the solubility of the acrylic resin (B-3) in alkali through the action of acid.

(b5)

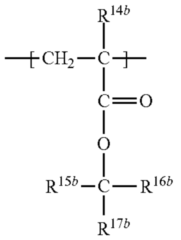

(b6)

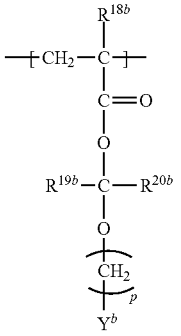

(b7)

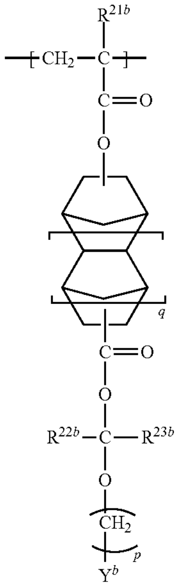

$R^{14b}$ and $R^{18b}$ to $R^{23b}$ in the above formulae (b5) to (b7) are each independently a hydrogen atom, a linear or branched alkyl group having 1 to 6 carbon atoms, a fluorine atom or a linear or branched fluorinated alkyl group having 1 to 6 carbon atoms. $R^{15b}$ to $R^{17b}$ are each independently a linear or branched alkyl group having 1 to 6 carbon atoms or a linear or branched fluorinated alkyl group having 1 to 6 carbon atoms. $R^{16b}$ and $R^{17b}$ may join each other to form a hydrocarbon ring having 5 to 20 carbon atoms together with a carbon atom to which both are attached. $Y^b$ represents an aliphatic cyclic group or an alkyl group optionally having a substituent. p is an integer of 0 to 4, and q is 0 or 1.

Examples of the linear or branched alkyl group include a methyl group, ethyl group, propyl group, isopropyl group, n-butyl group, isobutyl group, tert-butyl group, pentyl group, isopentyl group, neopentyl group, and the like. The fluorinated alkyl group refers to the abovementioned alkyl groups of which the hydrogen atoms are partially or entirely substituted with fluorine atoms.

In a case where the above $R^{16b}$ and $R^{17b}$ do not form hydrocarbon ring by joining each other, a linear or branched alkyl group having 2 to 4 carbon atoms is preferred as the above $R^{15b}$, $R^{16b}$ and $R^{17b}$ in view of high contrast, good resolution, good focal depth-width and the like. As the above $R^{19b}$, $R^{20b}$, $R^{22b}$ and $R^{23b}$, preferred is a hydrogen atom or a methyl group.

The above $R^{16b}$ and $R^{17b}$ may form an aliphatic cyclic group having 5 to 20 carbon atoms together with a carbon atom to which the both are attached. Specific examples of the alicyclic group are the groups of monocycloalkanes and polycycloalkanes such as bicycloalkanes, tricycloalkanes and tetracycloalkanes from which at least one hydrogen atom is removed. Specific examples thereof are monocycloalkanes such as cyclopentane, cyclohexane, cycloheptane and cyclooctane and polycycloalkanes such as adamantane, norbornane, isobornane, tricyclodecane and tetracyclododecane from which at least one hydrogen atom is removed. Particularly preferable are cyclohexane and adamantane from which at least one hydrogen atom is removed (that may further have a substituent).

Further, in a case where an aliphatic cyclic group to be formed with the above $R^{16b}$ and $R^{17b}$ has a substituent on the ring backbone thereof, examples of the substituent include a polar group such as a hydroxy group, a carboxyl group, a cyano group and an oxygen atom (=O), and a linear or branched alkyl group having 1 to 4 carbon atoms. As the polar group, an oxygen atom (=O) is particularly preferred.

The aforementioned $Y^b$ is an alicyclic group or an alkyl group; and examples thereof are monocycloalkanes and polycycloalkanes such as bicycloalkanes, tricycloalkanes and tetracycloalkanes from which at least one hydrogen atom is removed. Specific examples thereof are monocycloalkanes such as cyclopentane, cyclohexane, cycloheptane and cyclooctane, and polycycloalkanes such as adamantane, norbornane, isobornane, tricyclodecane and tetracyclododecane, from which at least one hydrogen atom is removed. Particularly preferable is adamantane from which at least one hydrogen atom is removed (that may further have a substituent).

When the alicyclic group of the abovementioned $Y^b$ has a substituent on the ring skeleton, the substituent is exemplified by polar groups such as a hydroxide group, carboxyl group, cyano group and oxygen atom (=O), and linear or branched lower alkyl groups having 1 to 4 carbon atoms. The polar group is preferably an oxygen atom (=O) in particular.

When $Y^b$ is an alkyl group, it is preferably a linear or branched alkyl group having 1 to 20 carbon atoms, and more preferably 6 to 15 carbon atoms. Preferably, the alkyl group is an alkoxyalkyl group in particular; and examples of the alkoxyalkyl group include a 1-methoxyethyl group, 1-ethoxyethyl group, 1-n-propoxyethyl group, 1-isopropoxyethyl group, 1-n-butoxyethyl group, 1-isobutoxyethyl group, 1-tert-butoxyethyl group, 1-methoxypropyl group, 1-ethoxypropyl group, 1-methoxy-1-methylethyl group, 1-ethoxy-1-methylethyl group, and the like.

Preferable specific examples of the structural unit represented by the above formula (b5) are those represented by the following formulae (b5-1) to (b5-33).

-continued
(b5-1)
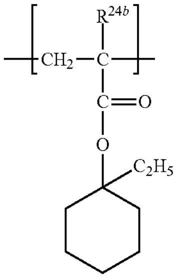
(b5-2)
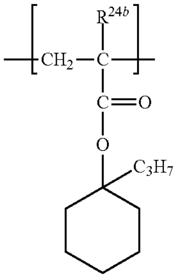
(b5-3)
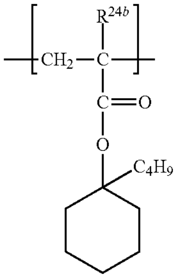
(b5-4)
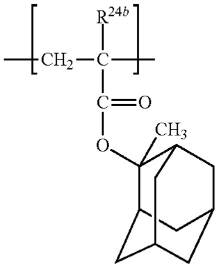
(b5-5)
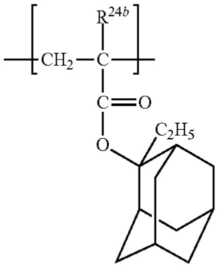
(b5-6)
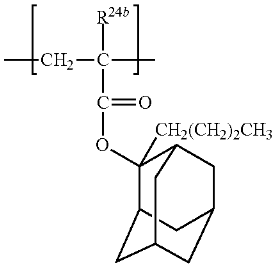
(b5-7)
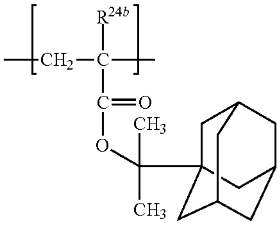
(b5-8)
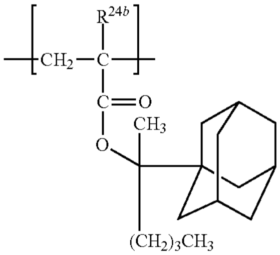
(b5-9)
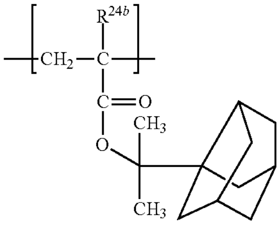
(b5-10)
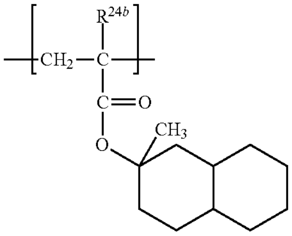
(b5-11)
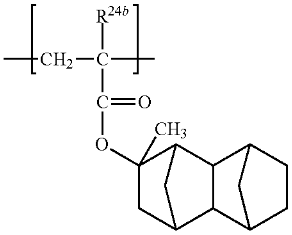

-continued
(b5-12)
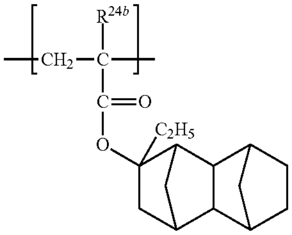
(b5-13)
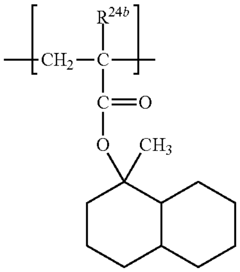
(b5-14)
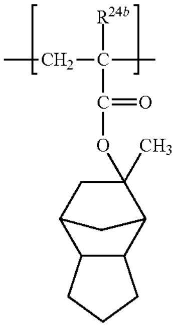
(b5-15)
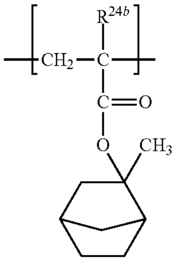
(b5-16)
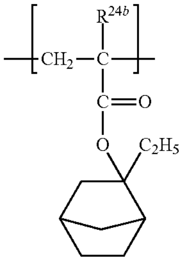
-continued
(b5-17)
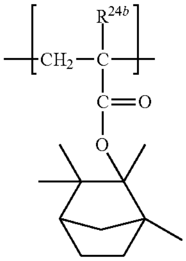
(b5-18)
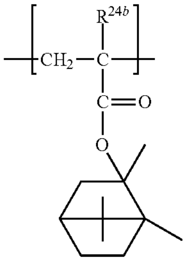
(b5-19)
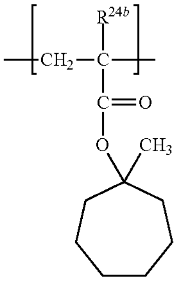
(b5-20)
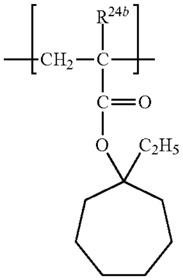
(b5-21)
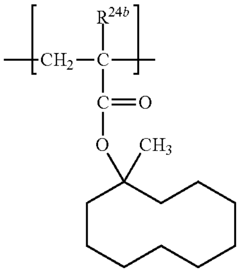

-continued
(b5-22)
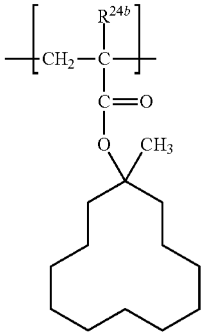
(b5-23)
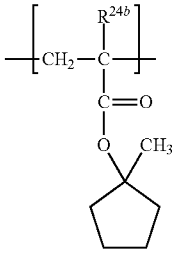
(b5-24)
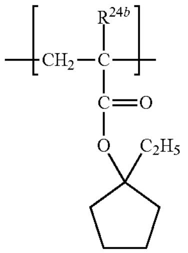
(b5-25)
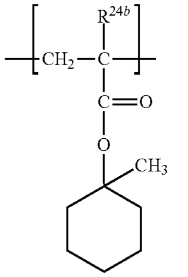
(b5-26)
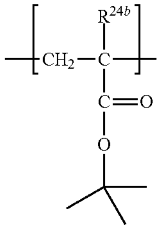
(b5-27)
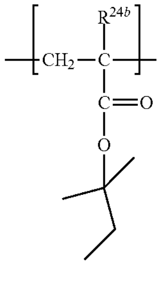
-continued
(b5-28)
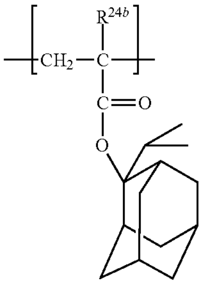
(b5-29)
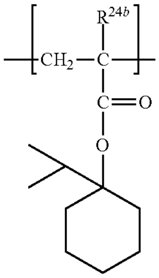
(b5-30)
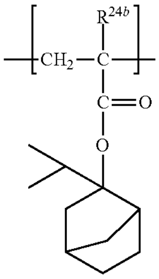
(b5-31)
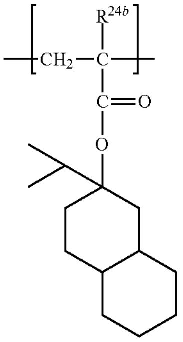
(b5-32)
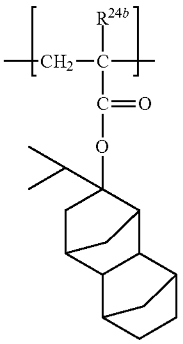

-continued
(b5-33)
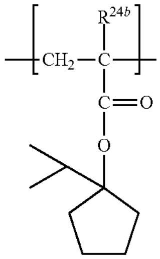
In the formulae (b5-1) to (b5-33), $R^{24b}$ represents a hydrogen atom or a methyl group.
Preferable specific examples of the structural unit represented by the formula (b6) include those represented by the following formulae (b6-1) to (b6-25).
(b6-1)
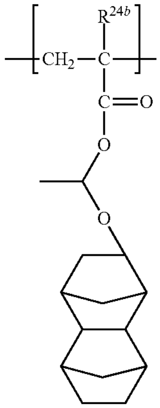
(b6-2)
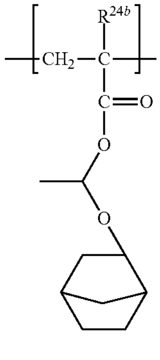
(b6-3)
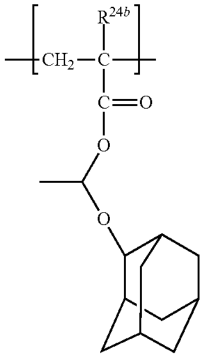
-continued
(b6-4)
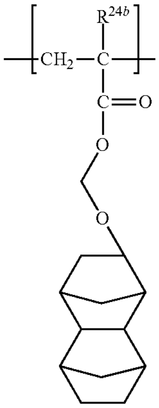
(b6-5)
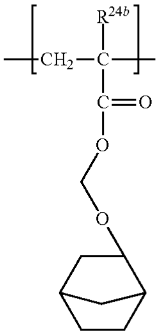
(b6-6)
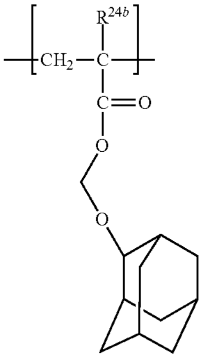
(b6-7)
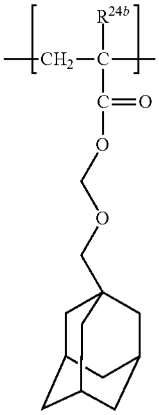

-continued
(b6-8)
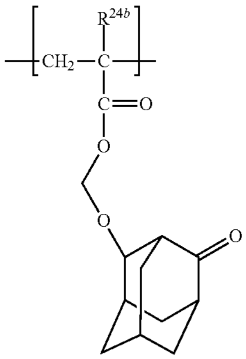
(b6-9)
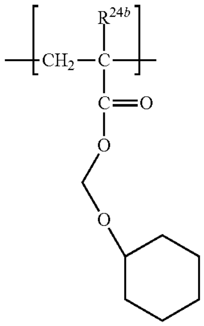
(b6-10)
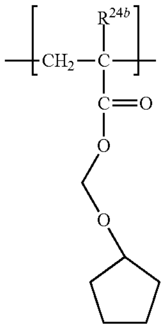
(b6-11)
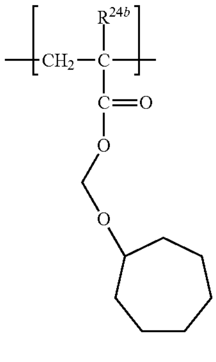
-continued
(b6-12)
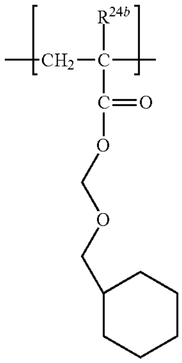
(b6-13)
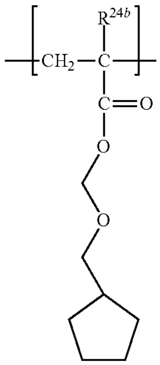
(b6-14)
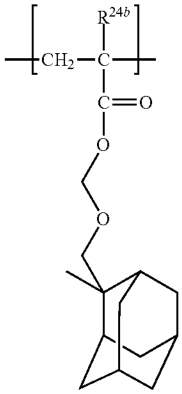
(b6-15)
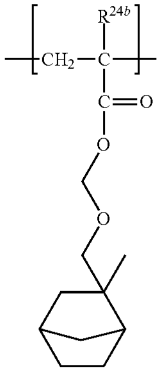

-continued
(b6-16)
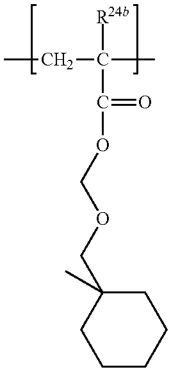
(b6-17)
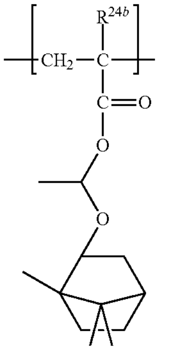
(b6-18)
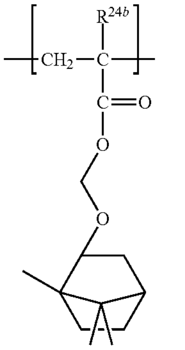
(b6-19)
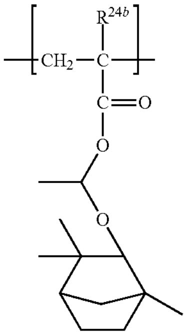
-continued
(b6-20)
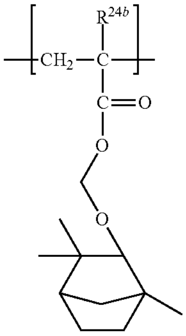
(b6-21)
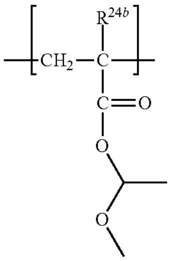
(b6-22)
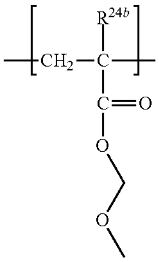
(b6-23)
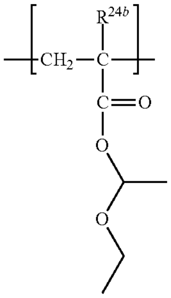
(b6-24)
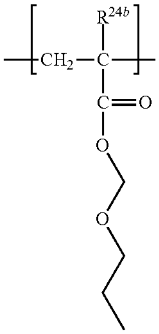

-continued
(b6-25)
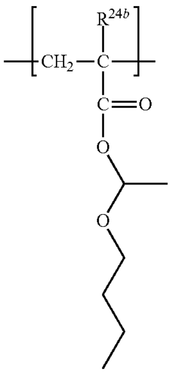
In the formulae (b6-1) to (b6-25), $R^{24b}$ represents a hydrogen atom or a methyl group.
Preferable specific examples of the structural unit represented by the formula (b7) include those represented by the following formulae (b7-1) to (b7-15).
(b7-1)
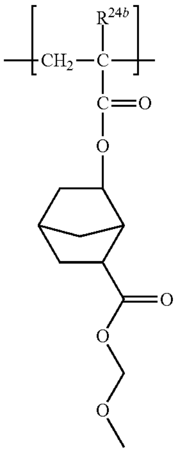
(b7-2)
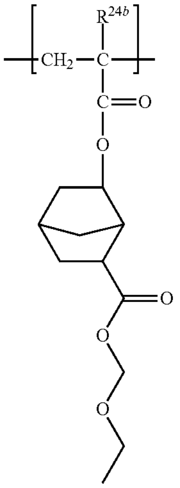
-continued
(b7-3)
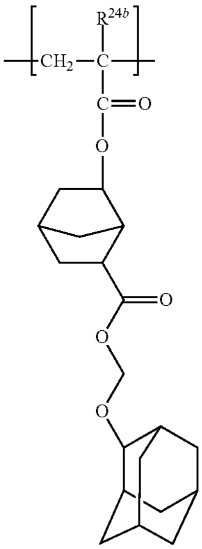
(b7-4)
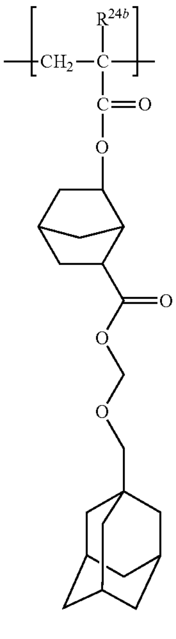

-continued
(b7-5)
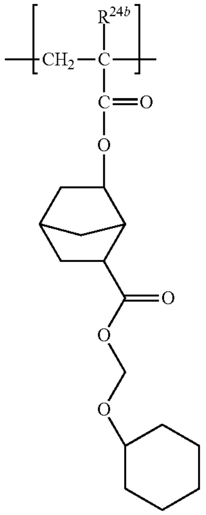
(b7-6)
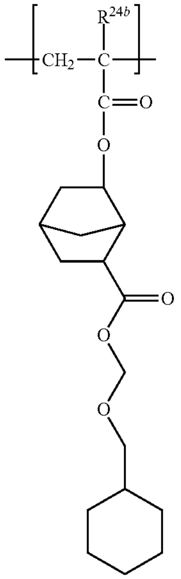
(b7-7)
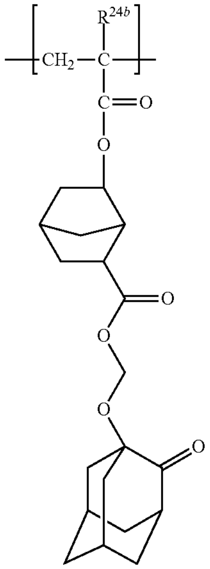
-continued
(b7-8)
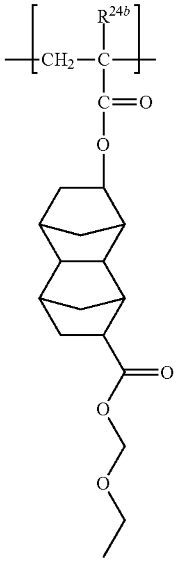
(b7-9)
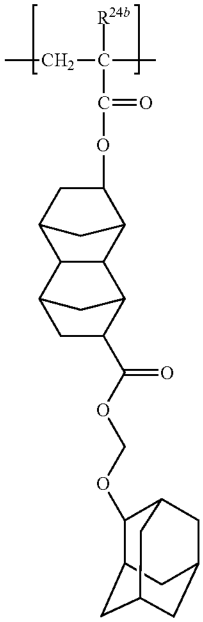

-continued
(b7-10)
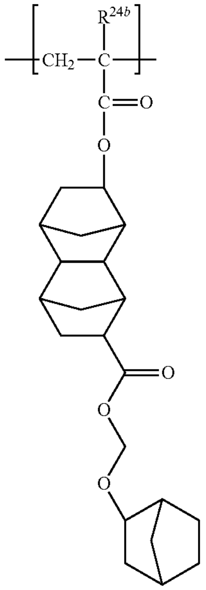
(b7-11)
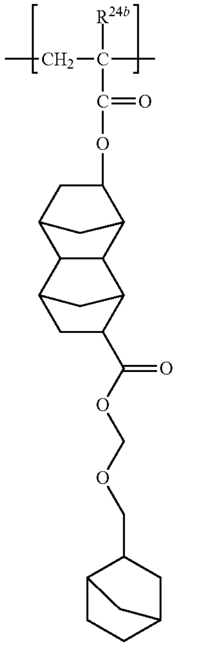
-continued
(b7-12)
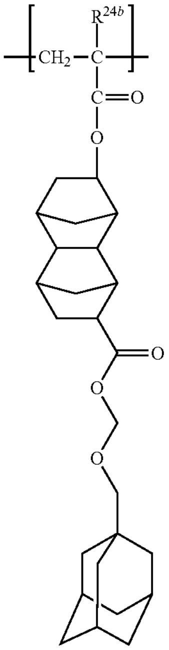
(b7-13)
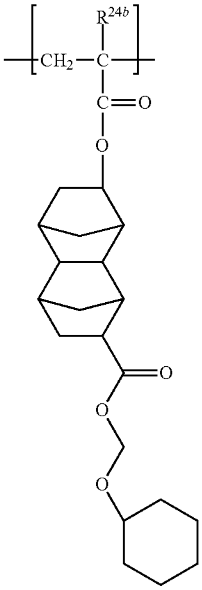

-continued (b7-14)

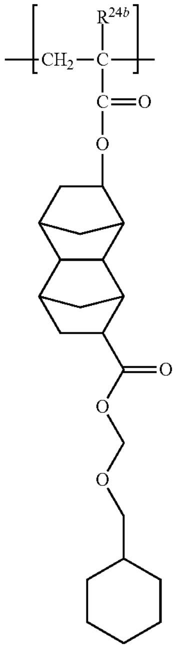

(b7-15)

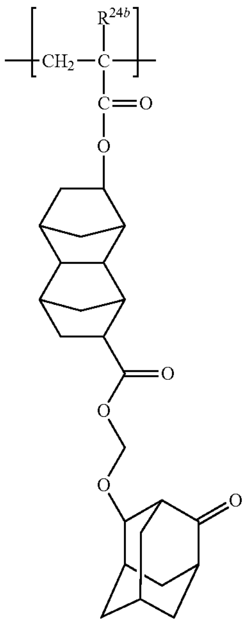

In the above formula (b7-1) to (b7-15), $R^{24b}$ represents a hydrogen atom or a methyl group.

Among the constituent units represented by the formulae (b5) to (b7) described above, those represented by the formula (b6) are preferred in that they can be easily synthesized and relatively easily sensitized. Further, among the constituent units represented by the formula (b6), those in which $Y^b$ is an alkyl group are preferred, and those in which one or both of $R^{19b}$ and $R^{20b}$ are alkyl groups are preferred.

Further, the (B-3) acrylic resin is preferably a resin comprising a copolymer comprising a constituent unit derived from a polymerizable compound having an ether bond together with a constituent unit represented by the above formulae (b5) to (b7).

Illustrative examples of the polymerizable compound having an ether linkage include radical polymerizable compounds such as (meth)acrylic acid derivatives having an ether linkage and an ester linkage, and specific examples thereof include 2-methoxyethyl(meth)acrylate, 2-ethoxyethyl(meth)acrylate, methoxytriethylene glycol(meth)acrylate, 3-methoxybutyl(meth)acrylate, ethylcarbitol(meth)acrylate, phenoxypolyethylene glycol(meth)acrylate, methoxypolyethylene glycol(meth)acrylate, methoxypolypropylene glycol(meth)acrylate, tetrahydrofurfuryl(meth)acrylate, and the like. Also, the polymerizable compound having an ether linkage is preferably, 2-methoxyethyl(meth)acrylate, 2-ethoxyethyl(meth)acrylate, or methoxytriethylene glycol(meth)acrylate. These polymerizable compounds may be used alone, or in combinations of two or more thereof.

Furthermore, the (B-3) acrylic resin may contain another polymerizable compound as a structural unit in order to moderately control physical or chemical properties. The polymerizable compound is exemplified by conventional radical polymerizable compounds and anion polymerizable compounds.

Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid and 2-methacryloyloxyethyl hexahydrophthalic acid; (meth)acrylic acid alkyl esters such as methyl(meth)acrylate, ethyl (meth)acrylate, butyl(meth)acrylate and cyclohexyl(meth)acrylate; (meth)acrylic acid hydroxyalkyl esters such as 2-hydroxyethyl(meth)acrylate and 2-hydroxypropyl(meth)acrylate; (meth)acrylic acid aryl esters such as phenyl(meth)acrylate and benzyl(meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; amide bond-containing polymerizable compounds such as acrylamide and methacrylamide; and the like.

As described above, the (B-3) acrylic resin may comprise a constituent unit derived from a polymerizable compound having a carboxyl group such as the above monocarboxylic acids and dicarboxylic acids. However, preferably, the (B-3) acrylic resin does not substantially comprise a constituent unit derived from a polymerizable compound having a carboxyl group because a resist pattern comprising a nonresist section having a good rectangular cross-sectional shape is easier to form. Specifically, the proportion of a constituent unit derived from a polymerizable compound having a carboxyl group in the (B-3) acrylic resin is preferably 5% by mass or less, more preferably 3% by mass or less, and in particular preferably 1% by mass or less.

Furthermore, examples of the polymerizable compound include (meth)acrylic acid esters having a non-acid-dissociative aliphatic polycyclic group, and vinyl group-containing aromatic compounds. As the non-acid-dissociative aliphatic polycyclic group, particularly, a tricyclodecanyl group, an adamantyl group, a tetracyclododecanyl group, an isobornyl group, a norbornyl group, and the like are preferred from the viewpoint of easy industrial availability.

These aliphatic polycyclic groups may have a linear or branched alkyl group having 1 to 5 carbon atoms as a substituent.

Specific examples of the (meth)acrylic acid esters having a non-acid-dissociative aliphatic polycyclic group include compounds having structures represented by the following formulae (b8-1) to (b8-5).

(b8-1)

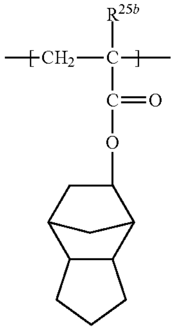

(b8-2)

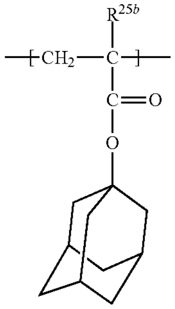

(b8-3)

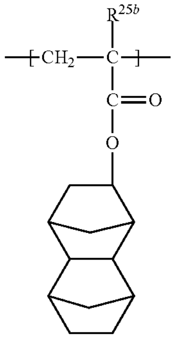

(b8-4)

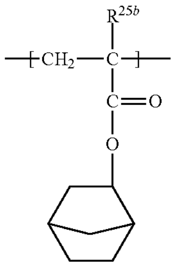

-continued (b8-5)

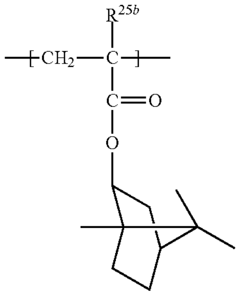

In formulae (b8-1) to (b8-5), $R^{25b}$ represents a hydrogen atom or a methyl group.

As the (B-3) acrylic resin, those comprising 5% by mass or more of the constituent unit (b-3) comprising a $-SO_2$-containing cyclic group or a lactone-containing cyclic group are preferred, and those comprising 10% by mass or more are more preferred, and those comprising 10 to 50% by mass are particularly preferred, and those comprising 10 to 30% by mass are most preferred. In a case where the photosensitive resin composition comprises the constituent unit (b-3) comprising an $-SO_2$-containing cyclic group or a lactone-containing cyclic group in an amount within the range described above, good developmentability and a good pattern shape can be easily achieved simultaneously.

Further, in the (B-3) acrylic resin, a constituent unit represented by the aforementioned formulae (b5) to (b7) is preferably contained in an amount of 5% by mass or more, more preferably 10% by mass or more, and in particular preferably 10 to 50% by mass.

The (B-3) acrylic resin preferably comprises the above constituent unit derived from a polymerizable compound having an ether bond. The content of the constituent unit derived from a polymerizable compound having an ether bond in the (B-3) acrylic resin is preferably 0 to 50% by mass, more preferably 5 to 30% by mass.

The (B-3) acrylic resin preferably comprises the above constituent unit derived from (meth)acrylic acid esters having a non-acid-dissociative aliphatic polycyclic group. The content of the constituent unit derived from (meth)acrylic acid esters having a non-acid-dissociative aliphatic polycyclic group in the (B-3) acrylic resin is preferably 0 to 50% by mass, more preferably 5 to 30% by mass.

As long as the photosensitive resin composition contains a predetermined amount of the (B-3) acrylic resin, an acrylic resin other than the (B-3) acrylic resin described above can also be used as the (B) resin. There is no particular limitation for such an acrylic resin other than the (B-3) acrylic resin as long as it comprises a constituent unit represented by the formulae (b5) to (b7).

The mass-average molecular weight of the (B) resin described above in terms of polystyrene is preferably 10000 to 600000, more preferably 20000 to 400000, and even more preferably 30000 to 300000. A mass-average molecular weight within these ranges allows a photosensitive resin layer to maintain sufficient strength without reducing detachability from a substrate, and can further prevent a swelled profile and crack generation when plating.

It is also preferred that the (B) resin has a dispersivity of no less than 1.05. Dispersivity herein indicates a value of a mass average molecular weight divided by a number average molecular weight. A dispersivity in the range described above can avoid problems with respect to stress resistance on intended plating or possible swelling of metal layers resulting from the plating process.

The content of the (B) resin is preferably 5 to 60% by mass with respect to the total mass of the photosensitive resin composition.

(C) Alkali-soluble resin

The photosensitive resin composition may further contain a (C) alkali-soluble resin in order to improve crack resistance, if necessary. The alkali-soluble resin as referred to herein may be determined as follows. A solution of the resin to give a resin concentration of 20% by mass (solvent: propylene glycol monomethyl ether acetate) is used to form a resin film having a film thickness of 1 μm on a substrate, and immersed in an aqueous 2.38% by mass TMAH solution for 1 min.

As the (C) alkali-soluble resin, various resins conventionally compounded in a positive-type photosensitive resin composition may be used within a range where the objects of the present invention are not impaired. However, the photosensitive resin composition preferably does not comprise a resin having a carboxyl group as an alkali-soluble group. As the (C) alkali-soluble resin, preferred is at least one resin selected from the group consisting of a (C1) novolak resin, a (C2) polyhydroxystyrene resin and a (C3) acrylic resin.

[(C1) Novolak Resin]

The (C1) novolak resin may be prepared by addition condensation between, for example, aromatic compounds having a phenolic hydroxy group (hereinafter, merely referred to as "phenols") and aldehydes in the presence of an acid catalyst.

Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethyl phenol, 3,4,5-trimethyl phenol, p-phenylphenol, resorcinol, hydroquinone, hydroquinone monomethyl ether, pyrogallol, phloroglycinol, hydroxydiphenyl, bisphenol A, gallic acid, gallic acid ester, α-naphthol, β-naphthol, and the like.

Examples of the aldehydes include formaldehyde, furfural, benzaldehyde, nitrobenzaldehyde, acetaldehyde, and the like.

The catalyst used in the addition condensation reaction, which is not specifically limited, is exemplified by hydrochloric acid, nitric acid, sulfuric acid, formic acid, oxalic acid, acetic acid, etc., in regards to acid catalyst.

The flexibility of the novolak resins can be enhanced still more when o-cresol is used, a hydrogen atom of a hydroxide group in the resins is substituted with other substituents, or bulky aldehydes are used.

The mass average molecular weight [sic] of (C1) novolac resin (D1) is not particularly limited as long as the purpose of the present invention is not impaired, but the mass average molecular weight is preferably 1,000 to 50,000.

[(C2) Polyhydroxystyrene Resin]

The hydroxystyrene compound to constitute the (C2) polyhydroxystyrene resin is exemplified by p-hydroxystyrene, α-methylhydroxystyrene, α-ethylhydroxystyrene, and the like.

Among these, the (C2) polyhydroxystyrene resin is preferably prepared to give a copolymer with a styrene resin. The styrene compound to constitute the styrene resin is exemplified by styrene, chlorostyrene, chloromethylstyrene, vinyltoluene, α-methylstyrene, and the like.

The mass average molecular weight of the (C2) polyhydroxystyrene resin is not particularly limited as long as the purpose of the present invention is not impaired, but the mass average molecular weight is preferably 1,000 to 50,000.

[(C3) Acrylic Resin]

It is preferred that the (C3) acrylic resin includes a structural unit derived from a polymerizable compound having an ether linkage and a structural unit derived from a polymerizable compound having a carboxyl group.

Illustrative examples of the polymerizable compound having an ether linkage include (meth)acrylic acid derivatives having an ether linkage and an ester linkage such as 2-methoxyethyl(meth)acrylate, methoxytriethylene glycol (meth)acrylate, 3-methoxybutyl(meth)acrylate, ethylcarbitol (meth)acrylate, phenoxypolyethylene glycol(meth)acrylate, methoxypolypropylene glycol(meth)acrylate, tetrahydrofurfuryl(meth)acrylate, and the like. The polymerizable compound having an ether linkage is preferably, 2-methoxyethyl acrylate, and methoxytriethylene glycol acrylate. These polymerizable compounds may be used alone, or in combinations of two or more.

Illustrative examples of the polymerizable compound having a carboxyl group include monocarboxylic acids such as acrylic acid, methacrylic acid and crotonic acid; dicarboxylic acids such as maleic acid, fumaric acid and itaconic acid; compounds having a carboxyl group and an ester linkage such as 2-methacryloyloxyethyl succinic acid, 2-methacryloyloxyethyl maleic acid, 2-methacryloyloxyethyl phthalic acid and 2-methacryloyloxyethyl hexahydrophthalic acid. The polymerizable compound having a carboxyl group is preferably, acrylic acid and methacrylic acid. These polymerizable compounds may be used alone, or in combinations of two or more thereof.

The mass average molecular weight of the (C3) acrylic resin is not particularly limited as long as the purpose of the present invention is not impaired, but the mass average molecular weight is preferably 50,000 to 800,000.

The (C) alkali-soluble resin is used such that the content of the (B-3) acrylic resin containing a constituent unit derived from an acrylic acid ester comprising the aforementioned —$SO_2$-containing cyclic group or the lactone-containing cyclic group relative to the total mass of the (B) resin and the (C) alkali-soluble resin in a photosensitive resin composition is 70% by mass or more. Therefore, the content of the (C) alkali soluble resin in a photosensitive resin composition is 30% by mass or less relative to the total amount of the above (B) resin resin and the (C) alkali soluble resin, preferably 20% by mass or less, more preferably 10% by mass or less, and in particular preferably 0% by mass. A low content of the (C) alkali soluble resin tends to produce a photosensitive resin composition having superior sensitivity.

(D) Acid-Diffusion Control Agent

Preferably, a photosensitive resin composition further contains a (D) acid-diffusion control agent in order to improve the formation of a good pattern shape and the post-exposure delay stability of a photosensitive resin film. As the (D) acid-diffusion control agent, a (D1) nitrogen-containing compound is preferred, and if desired, a (D2) organic carboxylic acid, or an oxo acid of phosphorus or derivatives thereof may be further contained.

[(D1) Nitrogen-Containing Compound]

Examples of the (D1) nitrogen-containing compound (E1) include trimethylamine, diethylamine, triethylamine, di-n-propylamine, tri-n-propylamine, tri-n-pentylamine, tribenzylamine, diethanolamine, triethanolamine, n-hexylamine, n-heptylamine, n-octylamine, n-nonylamine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrrolidone, N-methylpyrrolidone, methylurea, 1,1-dimethylurea, 1,3-dimethylurea, 1,1,3,3,-tetramethylurea, 1,3-diphenylurea, imidazole, benzimidazole, 4-methylimidazole, 8-oxyquinoline, acridine, purine, pyrrolidine, piperidine, 2,4,6-tri(2-pyridyl)-S-triazine, morpholine, 4-methylmorpholine, piperazine, 1,4-dimethylpiperazine, 1,4-diazabicyclo[2.2.2]octane, pyridine and the like. These may be used alone, or in combinations of two or more thereof.

The (D1) nitrogen-containing compound may be used in an amount typically in the range of 0 to 5 parts by mass, and particularly in the range of 0 to 3 parts by mass, with respect to 100 parts by mass of total mass of the (B) resin and the (C) alkali-soluble resin.

[(D2) Organic Carboxylic Acid or Oxo Acid of Phosphorus or Derivative Thereof]

Among the (D2) organic carboxylic acid, or the oxo acid of phosphorus or the derivative thereof, specific preferred examples of the organic carboxylic acid include malonic acid, citric acid, malic acid, succinic acid, benzoic acid, salicylic acid and the like, and salicylic acid is particularly preferred.

Examples of the oxo acid of phosphorus or derivatives thereof include phosphoric acid and derivatives such as esters thereof such as, e.g., phosphoric acid, phosphoric acid di-n-butyl ester, and phosphoric acid diphenyl ester; phosphonic acid and derivatives such as esters thereof such as, e.g., phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives such as esters thereof such as, e.g., phosphinic acid and phenylphosphinic acid; and the like. Among these, phosphonic acid is particularly preferred. These may be used alone, or in combinations of two or more thereof.

The (D2) organic carboxylic acid, or the oxo acid of phosphorus or the derivative thereof may be used in an amount typically in the range of 0 to 5 parts by mass, and particularly in the range of 0 to 3 parts by mass, with respect to 100 parts by mass of total mass of the (B) resin and the (C) alkali-soluble resin.

Moreover, in order to form a salt to allow for stabilization, the (D2) organic carboxylic acid, or the oxo acid of phosphorous or the derivative thereof is preferably used in an amount equivalent to that of the (D1) nitrogen-containing compound.

(S) Organic Solvent

The photosensitive resin composition may contain an (S) organic solvent for the purpose of adjusting coating properties and the like. There is no particular limitation on the (S) organic solvent as long as the objects of the present invention are not impaired, and an organic solvent appropriately selected from those conventionally used for positive-type photosensitive resin compositions can be used.

Specific examples of the (S) organic solvent include ketones such as acetone, methyl ethyl ketone, cyclohexanone, methyl isoamyl ketone, and 2-heptanone; polyhydric alcohols and derivatives thereof, like monomethyl ethers, monoethyl ethers, monopropyl ethers, monobutyl ethers and monophenyl ethers, such as ethylene glycol, ethylene glycol monoacetate, diethylene glycol, diethylene glycol monoacetate, propylene glycol, propylene glycol monoacetate, dipropylene glycol and dipropylene glycol monoacetate; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, methyl pyruvate, ethylethoxy acetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanate, 3-methoxybutyl acetate and 3-methyl-3-methoxybutyl acetate; aromatic hydrocarbons such as toluene and xylene; and the like. These may be used alone, or as a mixture of two or more thereof.

There is no particular limitation on the content of the (S) organic solvent as long as the objects of the present invention are not impaired. In a case where a photosensitive resin composition is used for a thick-film application in which a photosensitive resin layer obtained by the spin coating method and the like has a film thickness of 10 μm or more, the (S) organic solvent is preferably used in a range where the solid content concentration of the photosensitive resin composition is 20 to 80% by mass, preferably 30 to 70% by mass.

Method of Preparing Chemically Amplified Positive-Type Photosensitive Resin Composition A chemically amplified positive-type photosensitive resin composition is prepared by mixing and stirring the above components by the common method. Machines which can be used for mixing and stirring the above components include dissolvers, homogenizers, 3-roll mills and the like. After uniformly mixing the above components, the resulting mixture may be filtered through a mesh, a membrane filter and the like.

Thick Photosensitive Dry Film

The photosensitive resin composition described above can also suitably be used as a material for a photosensitive resin layer of a thick photosensitive dry film. The thick photosensitive dry film has a base film and a thick photosensitive resin layer formed on a surface of the base film, and this thick photosensitive resin layer comprises the aforementioned photosensitive resin composition.

As the base film, those having light permeability are preferred. Specific examples include a polyethylene terephthalate (PET) film, a polypropylene (PP) film, a polyethylene (PE) film and the like, and a polyethylene terephthalate (PET) film is preferred in view of the superior balance between light permeability and break strength.

When forming a thick photosensitive resin layer on a base film, the photosensitive resin composition according to the present invention is applied and dried on the base film so that the film thickness after dried is preferably 5 to 300 μm, more preferably 25 to 150 μm, and in particular preferably 40 to 130 μm using an applicator, a bar coater, a wire bar coater, a roll coater, a curtain flow coater and the like. The photosensitive resin layer formed comprises the (A) acid generator that produces an acid by being irradiated with an active ray or radiation, and the (B) resin whose solubility in alkali increases under the action of acid, and optionally comprises the (S) organic solvent.

The thick photosensitive dry film may further have a protective film on the photosensitive resin layer. Examples of the protective film include a polyethylene terephthalate (PET) film, a polypropylene (PP) film, a polyethylene (PE) film and the like.

<<Method of Manufacturing Thick Resist Pattern>>

There is no particular limitation on the method of forming a thick resist pattern with the photosensitive resin composition described above, but preferred methods include a method comprising a laminating step of laminating a photosensitive resin layer comprising a photosensitive resin composition on a substrate, a exposure step of irradiating the photosensitive resin layer with an active ray or radiation, and a developing step of developing the photosensitive resin layer after the exposure.

There is no particular limitation on the substrate on which a photosensitive resin layer is laminated, and conventionally known substrates can be used. Examples include substrates for an electronic part, those on which a predetermined wire pattern is formed and the like. Examples of the substrate include substrates made of metals such as silicon, silicon nitride, titanium, tantalum, palladium, titanium-tungsten, copper, chromium, iron, and aluminum; and glass substrates. Examples of the material used for the wiring patterns include copper, solder, chromium, aluminum, nickel, and gold.

The photosensitive resin layer is laminated on a substrate, for example, as follows. For example, a liquid photosensitive resin composition is applied on a substrate, and then a solvent is removed by heating to form a photosensitive resin layer having a desired film thickness. There is no particular limitation on the thickness of a photosensitive resin layer, as long as it has a thickness capable of forming a thick resist pattern having a thickness of 10 μm or more. There is no particular limitation on the film thickness of a photosensitive resin layer, but it is preferably 10 to 150 μm, more preferably 20 to 120 μm, and in particular preferably 20 to 100 μm.

Further, a photosensitive resin layer can also be laminated on a substrate by adhering the aforementioned thick film photosensitive dry film on the substrate.

As a method of applying a photosensitive resin composition onto a substrate, those such as the spin coating method, the slit coat method, the roll coat method, the screen printing method and the applicator method can be used. Pre-baking is preferably performed on a photosensitive resin layer. The conditions of pre-baking may differ depending on the components in a photosensitive resin composition, the blending ratio, the thickness of a coating film and the like. They are usually about 2 to 60 minutes at 70 to 150° C., preferably 80 to 140° C.

The photosensitive resin layer formed as described above is selectively irradiated (exposed) with an active ray or radiation, for example, an ultraviolet radiation or visible light with a wavelength of 300 to 500 nm through a mask having a predetermined pattern.

Low pressure mercury lamps, high pressure mercury lamps, super high pressure mercury lamps, metal halide lamps, argon gas lasers, etc. can be used for the light source of the radiation. The radiation may include micro waves, infrared rays, visible lights, ultraviolet rays, X-rays, γ-rays, electron beams, proton beams, neutron beams, ion beams, etc. The irradiation dose of the radiation may vary depending on the constituent of the photosensitive resin composition, the film thickness of the photosensitive resin layer, and the like. For example, when an ultra high-pressure mercury lamp is used, the dose may be 100 to 10,000 $mJ/cm^2$. The radiation includes a light ray to activate the (A) acid generator in order to generate an acid.

After the exposure, the diffusion of acid is promoted by heating the photosensitive resin layer using a known method to change the alkali solubility of the photosensitive resin layer at an exposed portion in the photosensitive resin film.

Subsequently, the exposed photosensitive resin layer is developed in accordance with a conventionally known method, and an unnecessary portion is dissolved and removed to form a predetermined resist pattern. At this time, an alkaline aqueous solution is used as a developing solution.

As the developing solution, an aqueous solution of an alkali such as, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene or 1,5-diazabicyclo[4.3.0]-5-nonane can be used. Also, an aqueous solution prepared by adding an adequate amount of a water-soluble organic solvent such as methanol or ethanol, or a surfactant to the aqueous solution of the alkali can be used as the developing solution.

The developing time may vary depending on the constituent of the photosensitive resin composition, the film thickness of the photosensitive resin layer, and the like. Usually, the developing time is 1 to 30 min. The method of the development may be any one of a liquid-filling method, a dipping method, a paddle method, a spray developing method, and the like.

After development, it is washed with running water for 30 to 90 seconds, and then dried with an air gun, an oven and the like. In this manner, a resist pattern can be produced. The resist pattern produced comprises the (A) acid generator that produces an acid by being irradiated with an active ray or radiation, and the (B) resin whose solubility in alkali increases under the action of acid.

<<Method of Manufacturing Substrate with Template>>

In a substrate with a template for forming a plated article, a resist pattern formed with a photosensitive resin composition is used as a template. A nonresist section in the resist pattern is filled with metal by plating to form a plated article.

When forming a substrate with a template, a metal substrate is used as a substrate. Note that in the metal substrate, the material of a surface on which a plated article is formed is to be a metal. Therefore, the metal substrate may be made entirely of a metal, or at least a portion of the surface on which a plated article is formed is made of a metal. As examples of a preferred metal as a material of a substrate, copper, gold and aluminum are preferred, and copper is more preferred.

The substrate with the template can be manufactured by a method similar to the aforementioned method of manufacturing a thick resist pattern except that the above metal substrate is used as a substrate, and the shape of a nonresist section in the resist pattern is designed according to the shape of a plated article.

<<Method of Manufacturing Plated Article>>

A conductor such as a metal may be embedded, by plating, into a nonresist section (a portion removed with a developing solution) in the template formed by the above method on the substrate to form a plated article, for example, like a contacting terminal such as a bump or a metal post. Note that there is no particular limitation on the method of plate processing, and various conventionally known methods can be used. As a plating liquid, in particular, a solder plating liquid, a copper plating liquid, a gold plating liquid and a nickel plating liquid are suitably used. Finally, the remaining template is removed with a stripping liquid and the like in accordance with a conventional method.

In the above method of manufacturing a plated article, the plated article is formed using a template comprising a nonresist section having a good rectangular cross-sectional shape and formed with a photosensitive resin composition. Therefore, the cross-sectional shape of the plated article formed will also have a good rectangular shape.

EXAMPLES

Below, the present invention will be described in more detail with reference to Examples, but the present invention shall not be limited to these Examples.

Examples 1 to 13 and Comparative Examples 1 to 4

In Examples and Comparative Examples, a compound represented by the following formula was used as the (A) acid generator.

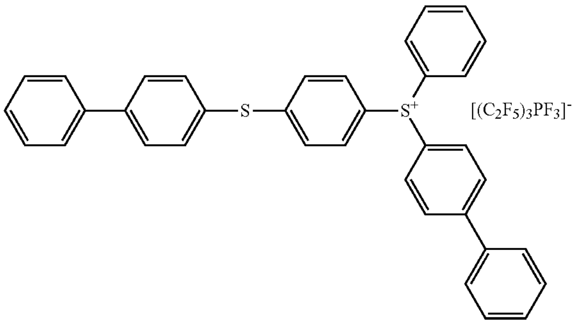 [SMILES: c1ccc(-c2ccc(Sc3ccc([S+](c4ccccc4)c4ccc(-c5ccccc5)cc4)cc3)cc2)cc1]

In Examples and Comparative Examples, the following polymers A to J, L and M, and the polymer K, a cresol novolak resin, were used as the (B) resin whose solubility in alkali increases under the action of acid or the (C) alkali soluble resin. Note that in a case where the polymer is a copolymer, a numerical value at the lower right of the parentheses at each unit constituting the copolymer means the proportion (% by mass) of the content of each unit relative to the mass of the copolymer. Further, the mass-average molecular weights (Mw) and dispersivity (Mw/Mn) of the polymers K to M are shown in Table 1.

Polymers A, B and C

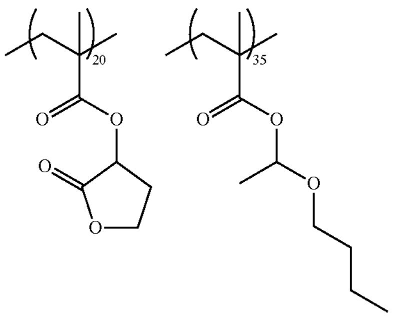

-continued

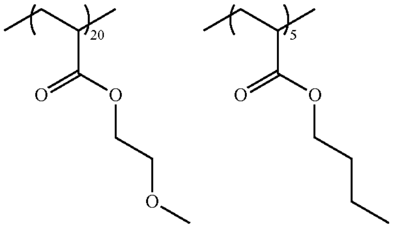

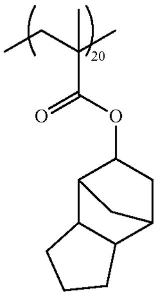

Polymer D

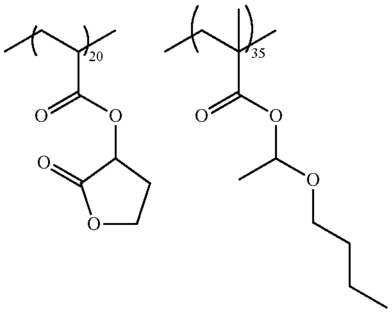

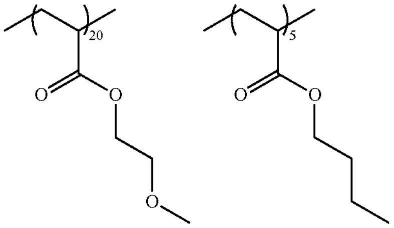

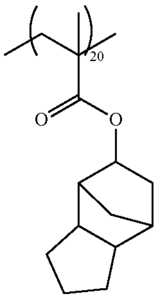

Polymer E

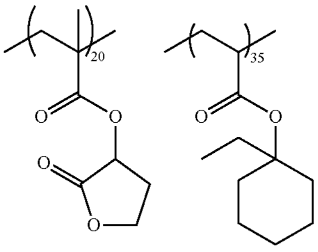

-continued
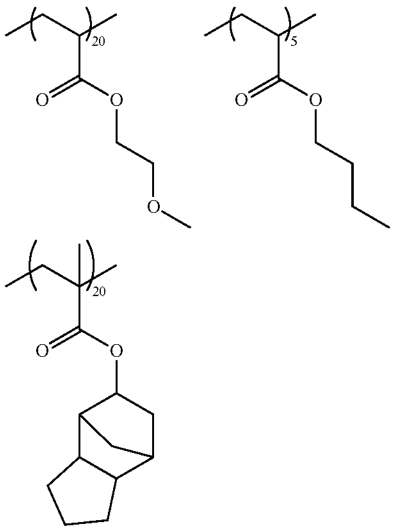
Polymer F
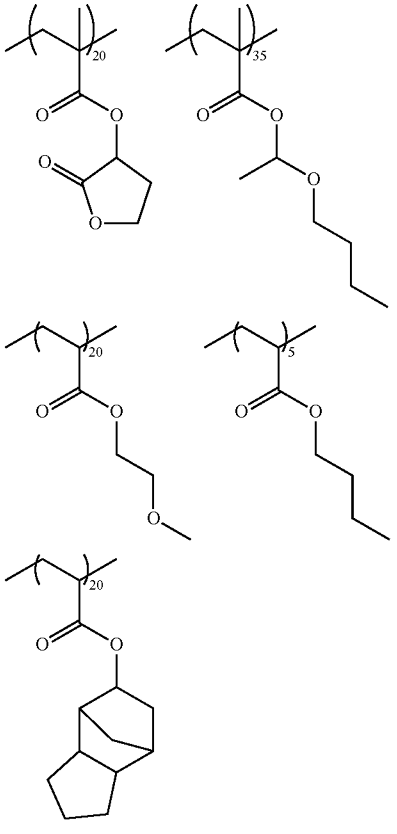
Polymer G
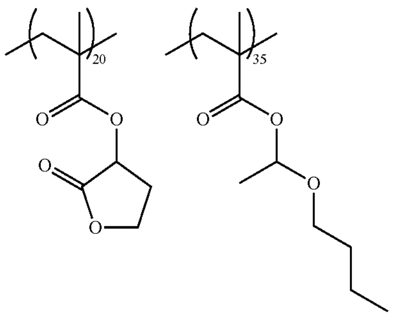
-continued
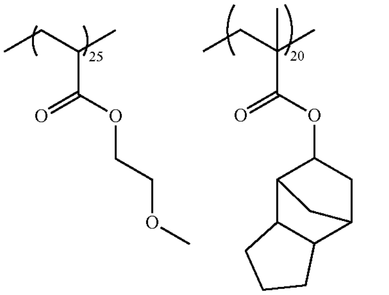
Polymer H
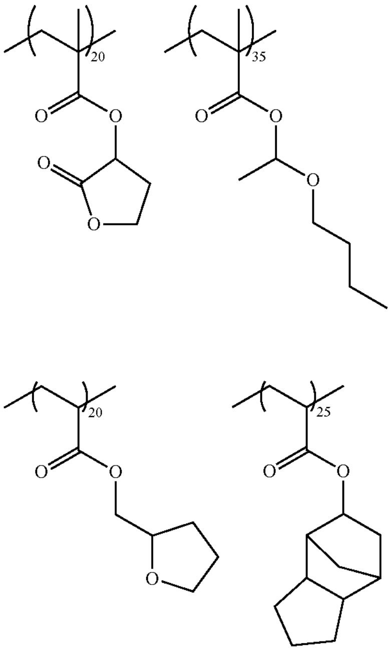
Polymer I
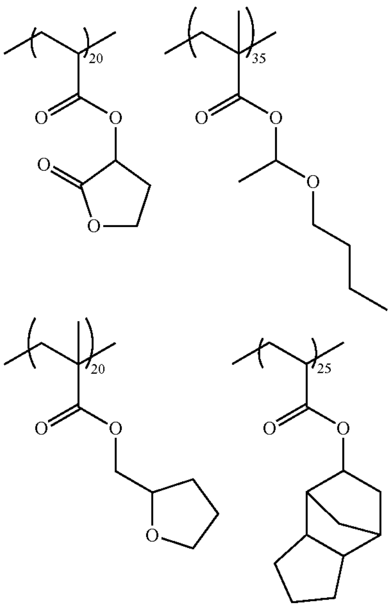

-continued

Polymer J

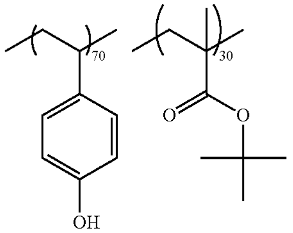

Polymer L

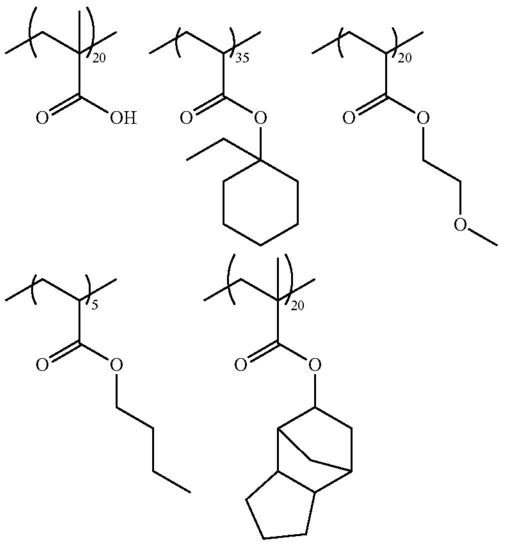

Polymer M

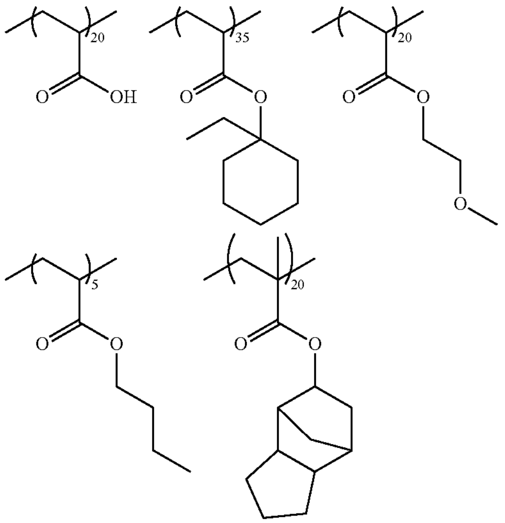

TABLE 1

| | Mass average molecular weight (Mw) | Dispersivity (Mw/Mn) |
|---|---|---|
| Polymer A | 40,000 | 2.6 |
| Polymer B | 80,000 | 3.1 |
| Polymer C | 120,000 | 3.2 |
| Polymer D | 40,000 | 2.6 |
| Polymer E | 40,000 | 2.6 |
| Polymer F | 40,000 | 2.6 |
| Polymer G | 40,000 | 2.6 |

TABLE 1-continued

| | Mass average molecular weight (Mw) | Dispersivity (Mw/Mn) |
|---|---|---|
| Polymer H | 40,000 | 2.6 |
| Polymer I | 120,000 | 3.2 |
| Polymer J | 12,000 | 2.4 |
| Polymer K | 8,000 | 6.2 |
| Polymer L | 40,000 | 2.6 |
| Polymer M | 40,000 | 2.7 |

In Examples and Comparative Examples, tri-n-pentylamine was used as an acid-diffusion control agent.

A resin of a type and amount shown in Table 2, 2 parts by mass of the above acid generator and 0.02 parts by mass of the above acid-diffusion control agent were dissolved in propyleneglycol monomethylether acetate so that the solid content concentration was to be 55% by mass to obtain the photosensitive resin compositions for Examples 1 to 13 and Comparative Examples 1 to 4. Using the photosensitive resin compositions obtained, the sensitivity when forming a thick resist pattern and the cross-sectional shape of a non-resist section in the thick resist pattern were evaluated in accordance with the following methods.

[Evaluation of Sensitivity]

The photosensitive resin compositions from Examples 1 to 13 and Comparative Examples 1 to 4 were each applied on an 8-inch copper substrate with a spin coater to form a thick photosensitive resin layer capable of forming a resist pattern having a film thickness of 10 μm, 65 μm or 100 μm. Then the photosensitive resin layers were pre-baked for 5 minutes at 140° C. After the pre-baking, using a mask having a hole pattern in a predetermined shape and an exposure device Prisma GHI (Ultratech Inc.), pattern exposure was performed with the ghi line while changing the exposure level in a stepwise fashion. Subsequently, the substrate was mounted on a hot plate to perform post-exposure baking (PEB) for 3 minutes at 100° C. Then, a 2.38% aqueous solution of tetramethylammonium hydroxide (TMAH) was added dropwise to the photosensitive resin layer, and allowed to stand for 60 seconds at 23° C. This was repeated 4 times for development. Subsequently, it was washed with running water and blown with nitrogen to obtain a thick resist pattern having a contact hole pattern with a diameter of 60 μm.

Then, an exposure level in which no pattern residue was observed, i.e., the minimum exposure level required to form a thick resist pattern was obtained, which was taken as a measure of sensitivity. Results are shown in Table 2 below.

[Evaluation of Cross-Sectional Shape of Nonresist Section]

Thick resist patterns each having a contact hole pattern with a diameter of 60 μm were formed with the photosensitive resin compositions from Examples 1 to 13 and Comparative Examples 1 to 4 as in the evaluation of sensitivity except that the exposure level was 1.2 times higher than the above minimum exposure level. Note that three thick resist patterns having a film thickness of 10 μm, 65 μm and 100 μm were formed for one photosensitive composition resin. The CDmax and CDmin in a cross-section of a nonresist section (hole) in the resist pattern formed were measured, and the rectangularity of the cross-section of the hole was evaluated by the value of CDmax/CDmin in accordance with the following criteria. CDmax and CDmin were determined by observing a cross-sectional shape of the resist pattern under a scanning electron microscope and measuring the maximum width (CDmax) and the minimum width (CDmin) of the nonresist section. The cross-sectional shape of a hole is of a better rectangle as the value of CDmax/CDmin is closer to 1. Evaluation results for cross-sectional shapes of nonresist sections are shown in Table 2 below.

Very Good: CDmax/CDmin is less than 1.1.

Good: CDmax/CDmin is 1.1 or more and less than 1.2.

Fair: CDmax/CDmin is 1.2 or more and less than 1.3.

Bad: CDmax/CDmin is 1.3 or more.

TABLE 2

| | Resin (Type/ Parts by mass) | Evaluation Results | | | | | |
|---|---|---|---|---|---|---|---|
| | | Film thickness of 10 μm | | Film thickness of 65 μm | | Film thickness of 100 μm | |
| | | Sensitivity ($mJ/cm^2$) | Cross-sectional shape | Sensitivity ($mJ/cm^2$) | Cross-sectional shape | Sensitivity ($mJ/cm^2$) | Cross-sectional shape |
| Ex. 1 | A/100 | 200 | Good | 300 | Good | 300 | Good |
| Ex. 2 | B/100 | 250 | Very good | 350 | Very good | 350 | Very good |
| Ex. 3 | C/100 | 400 | Very good | 600 | Very good | 600 | Very good |
| Ex. 4 | D/100 | 100 | Very good | 200 | Very good | 200 | Very good |
| Ex. 5 | E/100 | 500 | Good | 700 | Good | 700 | Good |
| Ex. 6 | F/100 | 100 | Good | 200 | Good | 200 | Good |
| Ex. 7 | G/100 | 200 | Good | 400 | Good | 400 | Good |
| Ex. 8 | H/100 | 200 | Good | 300 | Good | 300 | Good |
| Ex. 9 | I/100 | 200 | Good | 300 | Good | 500 | Good |
| Ex. 10 | A/90 J/10 | 300 | Good | 500 | Good | 1200 | Good |
| Ex. 11 | A/70 J/30 | 1000 | Good | 1200 | Good | 500 | Fair |
| Ex. 12 | A/90 K/10 | 300 | Good | 500 | Good | 1200 | Good |
| Ex. 13 | A/70 K/30 | 1000 | Good | 1200 | Good | 500 | Fair |
| Comp. Ex. 1 | L/100 | — | — | — | — | — | — |
| Comp. Ex. 2 | M/100 | — | — | — | — | — | — |
| Comp. Ex. 3 | A/60 J/40 | 2000 | Good | >2000 | — | >2000 | — |
| Comp. Ex. 4 | A/60 K/40 | 2000 | Good | >2000 | — | >2000 | — |

Examples 1 to 13 reveal that a resist pattern having a nonresist section having a good rectangular cross-sectional shape can be formed at a low exposure level, comprising the (A) acid generator capable of producing an acid when irradiated with an active ray or radiation, the (B) resin whose solubility in alkali increases under the action of acid and the (S) organic solvent, and comprising, as (B) the resin, the (B-3) acrylic resin containing a constituent unit derived from an acrylic acid ester comprising an —$SO_2$-containing cyclic group or a lactone-containing cyclic group.

Comparative Examples 1 and 2 reveal that in a case where a photosensitive resin composition comprising a resin not containing a constituent unit derived from an acrylic acid ester comprising an —$SO_2$-containing cyclic group or a lactone-containing cyclic group, but containing a constituent unit derived from unsaturated carboxylic acid is used as the (B) resin, the photosensitive resin films formed with the photosensitive resin compositions all dissolved in a developing solution, and resist patterns could not be formed.

According to Comparative Examples 3 and 4, in a case where the photosensitive resin composition is used in which the content of a resin containing a constituent unit derived from an acrylic acid ester comprising an —$SO_2$-containing cyclic group or a lactone-containing cyclic group in the (B) resin is less than 70% by mass, a resist pattern having a film thickness of about 10 μm can barely be formed under a high exposure level, but in a case where the film thickness of a resist pattern is 65 μm or more, the exposed portion was not completely dissolved in a developing solution even under an exposure level of 2000 $mJ/cm^2$ or more, and a resist pattern having a desired shape could not be formed.

Example 14

After applying the photosensitive resin composition from Example 1 on a PET film with an applicator, the coating film was dried to obtain the thick photosensitive dry film of Example 14 having a photosensitive resin layer with a film thickness of 120 μm.

A thick photosensitive resin layer was adhered on a copper sputtering wafer substrate to form a photosensitive resin layer having a film thickness of 120 μm on the substrate with the thick photosensitive dry film from Example 14 using a dry film laminator (EXL-1200HSF1-CE, Teikoku Taping System Co., Ltd.) under the conditions of a rate of 1 m/min., a pressure of 0.5 MPa (G), a stage temperature of 80° C. and a roll temperature of 300° C. The photosensitive resin layer formed was selectively exposed using a Prisma GHI (Ultratech Inc.). Subsequently, the substrate was mounted on a hot plate to perform post-exposure baking (PEB) for 3 minutes at 85° C. Then, a 2.38% aqueous solution of tetramethylammonium hydroxide (TMAH) was added dropwise to the photosensitive resin layer, and allowed to stand for 60 seconds at 23° C. This was repeated 4 times for development. Subsequently, it was washed with running water, and blown with nitrogen to obtain a thick resist pattern having a contact hole pattern with a diameter of 60 μm.

What is claimed is:

1. A chemically amplified positive photosensitive resin composition, comprising:

(A) an acid generator that produces an acid by being irradiated with an active ray or radiation, (B) a resin whose solubility in alkali increases under the action of acid, and (S) an organic solvent, wherein the resin (B) comprises an acrylic resin (B-3) comprising a constituent unit derived from an acrylic acid ester comprising a lactone-containing cyclic group provided that the acrylic resin (B-3) does not comprise a constituent unit derived from an acrylic acid ester comprising an —$SO_2$-containing cyclic group, and the acrylic resin (B-3) further comprises at least one constituent unit selected from the group consisting of constituent units represented by the following formulae (b5) to (b7), provided that the constituent unit represented by the formula (b5) does not comprise a constituent unit represented by the following formula (b5-5):

(b5)

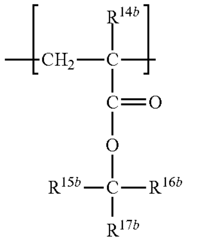

(b6)

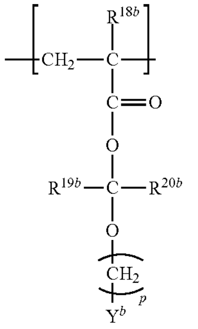

(b7)

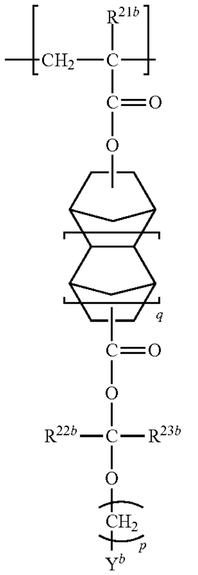

-continued (b5-5)

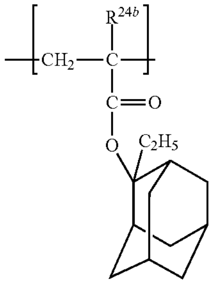

wherein $R^{14b}$ and $R^{18b}$ to $R^{23b}$ in the above formulae (b5) to (b7) are each independently a hydrogen atom, a linear or branched alkyl group having 1 to 6 carbon atoms, a fluorine atom or a linear or branched fluorinated alkyl group having 1 to 6 carbon atoms, $R^{15b}$ to $R^{17b}$ are each independently a linear or branched alkyl group having 1 to 6 carbon atoms or a linear or branched fluorinated alkyl group having 1 to 6 carbon atoms, $R^{16b}$ and $R^{17b}$ may join each other to form a hydrocarbon ring having 5 to 20 carbon atoms together with a carbon atom to which both are attached, $Y^b$ represents an aliphatic cyclic group or an alkyl group optionally having a substituent, p is an integer of 0 to 4, and q is 0 or 1, and $R^{24b}$ in the above formula (b5-5) represents a hydrogen atom or a methyl group, wherein the resin (B) has mass-average molecular weights (Mw) of 20,000 to 400,000, and the percentage of the acrylic resin (B-3) to the total mass of resin components contained in the composition is 70% by mass or more.

2. A photosensitive dry film comprising a base film and a photosensitive resin layer formed on the base film, wherein the layer comprises the composition according to claim 1.

3. The dry film according to claim 2, wherein the layer has a film thickness of 5 to 300 μm.

4. A method of manufacturing a resist pattern, comprising:

laminating a-photosensitive resin layer on a substrate, the layer comprising the composition according to claim 1, irradiating the layer with an active ray or radiation, and developing the layer after the exposure to form the resist pattern, wherein a film thickness of the resist pattern is 10 μm or more.

5. A method of manufacturing a substrate with a template, comprising:

laminating a photosensitive resin layer on a metal substrate, the layer comprising the composition according to claim 1;

irradiating the layer with an active ray or radiation; and developing the layer after the exposure to form the template that defines a plated article, wherein a film thickness of the template is 10 μm or more.

6. A method of manufacturing a plated article, comprising plating the substrate with the template manufactured by the method according to claim 5 to form the plated article inside the template.

* * * * *